(12) United States Patent
Zhang et al.

(10) Patent No.: US 12,550,538 B2
(45) Date of Patent: Feb. 10, 2026

(54) DISPLAY SUBSTRATE, MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Zhang, Beijing (CN); Weiyun Huang, Beijing (CN); Liang Song, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 657 days.

(21) Appl. No.: 17/996,289

(22) PCT Filed: Nov. 30, 2021

(86) PCT No.: PCT/CN2021/134670
§ 371 (c)(1),
(2) Date: Oct. 14, 2022

(87) PCT Pub. No.: WO2023/097529
PCT Pub. Date: Jun. 8, 2023

(65) Prior Publication Data
US 2024/0224599 A1    Jul. 4, 2024

(51) Int. Cl.
*H10K 59/122*    (2023.01)

(52) U.S. Cl.
CPC .................. *H10K 59/122* (2023.02)

(58) Field of Classification Search
None
See application file for complete search history.

(56) References Cited

U.S. PATENT DOCUMENTS

| | | | |
|---|---|---|---|
| 9,728,693 | B2 | 8/2017 | Hatano et al. |
| 11,545,529 | B2 | 1/2023 | Jia et al. |

(Continued)

FOREIGN PATENT DOCUMENTS

| | | | |
|---|---|---|---|
| CN | 103779470 A | 5/2014 | |
| CN | 107359263 A | 11/2017 | |

(Continued)

*Primary Examiner* — William C Trapanese
(74) *Attorney, Agent, or Firm* — LEASON ELLIS LLP

(57) ABSTRACT

A display substrate, a manufacturing method thereof and a display device are provided. The display substrate includes a base substrate and a plurality of sub-pixels on the base substrate. Each sub-pixel includes a light-emitting functional layer. A defining structure is provided between adjacent sub-pixels and includes a first sub-structure and second sub-structure stacked. Along an arrangement direction of adjacent sub-pixels, an edge of the second sub-structure protrudes relative to an edge of the first sub-structure to form a protruding portion; or, a side surface of the second sub-structure has a first slope angle, a side surface of the first sub-structure has a second slope angle, and at least one of the first slope angle and the second slope angle is greater than 60 degrees, and at least one of film layers included in the light-emitting functional layer is disconnected at the defining structure.

19 Claims, 5 Drawing Sheets

(56) References Cited

U.S. PATENT DOCUMENTS

| | | |
|---|---|---|
| 2017/0062528 A1 | 3/2017 | Aoyama et al. |
| 2020/0203384 A1 | 6/2020 | Huo |
| 2021/0367179 A1 | 11/2021 | Wang et al. |
| 2022/0032968 A1 | 2/2022 | Mukherjee et al. |
| 2022/0367581 A1 | 11/2022 | Wang et al. |

FOREIGN PATENT DOCUMENTS

| | | | | |
|---|---|---|---|---|
| CN | 108717942 A | | 10/2018 | |
| CN | 110164906 A | | 8/2019 | |
| CN | 110165062 A | | 8/2019 | |
| CN | 110890406 A | * | 3/2020 | ......... H01L 27/3246 |
| CN | 110993806 A | | 4/2020 | |
| CN | 111312923 A | | 6/2020 | |
| CN | 111627970 A | | 9/2020 | |
| CN | 111668380 A | | 9/2020 | |
| CN | 111668382 A | | 9/2020 | |
| CN | 112242494 A | | 1/2021 | |

\* cited by examiner

DISPLAY SUBSTRATE, MANUFACTURING METHOD THEREOF AND DISPLAY DEVICE

This application is a national stage application of International Application No. PCT/CN2021/134670 filed on Nov. 30, 2021, which is incorporated by reference herein in its entirety.

TECHNICAL FIELD

At least one embodiment of the present disclosure relates to a display substrate, a manufacturing method thereof and a display device.

BACKGROUND

With the development of display technology, users have higher and higher requirements for the performance of display devices. The performance requirements of high brightness and low power consumption of the display devices can be met as much as possible by cutting off the light-emitting material layer between adjacent sub-pixels to reduce signal crosstalk.

SUMMARY

Embodiments of the disclosure provide a display substrate, a manufacturing method thereof and a display device.

An embodiment of the disclosure provides a display substrate, comprising: a base substrate, comprising at least a first display region; a plurality of sub-pixels located in the first display region on the base substrate, each sub-pixel of at least a part of the plurality of sub-pixels comprising a light-emitting element, the light-emitting element comprising a light-emitting functional layer and a first electrode and a second electrode located on two sides of the light-emitting functional layer in a direction perpendicular to the base substrate, the first electrode being located between the light-emitting functional layer and the base substrate, and the light-emitting functional layer comprising a plurality of film layers, wherein the display substrate further comprises a defining structure, at least one defining structure is arranged between at least two adjacent sub-pixels, and the defining structure comprises a first sub-structure and a second sub-structure which are stacked, the first sub-structure is located between the second sub-structure and the base substrate, and a material of the first sub-structure is different from that of the second sub-structure; along an arrangement direction of adjacent sub-pixels, an edge of the second sub-structure in the defining structure between the adjacent sub-pixels protrudes relative to an edge of the first sub-structure to form a protruding portion; or, a slope angle between at least a part of a side surface of the second sub-structure and a plane parallel to a contact surface of the first sub-structure and the second sub-structure is a first slope angle, a slope angle between at least a part of a side surface of the first sub-structure and the plane parallel to the contact surface of the first sub-structure and the second sub-structure is a second slope angle, and at least one of the first slope angle and the second slope angle is greater than 60 degrees, and a surface area of the second sub-structure close to the first sub-structure is not less than an area of the contact surface between the first sub-structure and the second sub-structure, at least one of the plurality of film layers is disconnected at the defining structure.

For example, according to an embodiment of the disclosure, the material of the first sub-structure comprises an organic material, and the material of the second sub-structure comprises an inorganic nonmetallic material.

For example, according to an embodiment of the disclosure, each of the material of the first sub-structure and the material of the second sub-structure comprises inorganic nonmetallic materials.

For example, according to an embodiment of the disclosure, the display substrate further comprises: an organic layer, located between the second sub-structure and the base substrate.

For example, according to an embodiment of the disclosure, the material of the first sub-structure comprises an organic material, and the first sub-structure and the organic layer are an integrated structure; or the material of the first sub-structure comprises an inorganic nonmetallic material, and the first sub-structure is arranged on a surface of the organic layer on a side away from the base substrate.

For example, according to an embodiment of the disclosure, the defining structure further comprises a third sub-structure located between the first sub-structure and the base substrate, along the arrangement direction of adjacent sub-pixels, the edge of the first sub-structure in the defining structure between the adjacent sub-pixels protrudes relative to an edge of the third sub-structure, and the third sub-structure and the organic layer are an integrated structure.

For example, according to an embodiment of the disclosure, a slope angle between at least a part of a side surface of the third sub-structure and a plane parallel to a contact surface of the first sub-structure and the third sub-structure is a third slope angle, and the third slope angle is greater than 60 degrees.

For example, according to an embodiment of the disclosure, a first cross section of the first sub-structure taken by a plane along the arrangement direction of the adjacent sub-pixels and perpendicular to the base substrate comprises a rectangle; or the first cross section of the first sub-structure taken by the plane along the arrangement direction of the adjacent sub-pixels and perpendicular to the base substrate comprises a trapezoid, and a length of a bottom edge of the trapezoid on a side away from the base substrate is greater than a length of a bottom edge of the trapezoid on a side close to the base substrate; or the first cross section of the first sub-structure taken by the plane along the arrangement direction of adjacent sub-pixels and perpendicular to the base substrate comprises a trapezoid, and the length of the bottom edge of the trapezoid on the side away from the base substrate is smaller than the length of the bottom edge of the trapezoid on the side close to the base substrate.

For example, according to an embodiment of the disclosure, the first cross section of the first sub-structure taken by the plane along the arrangement direction of the adjacent sub-pixels and perpendicular to the base substrate comprises two short edges and two long edges extending in a direction parallel to the base substrate, the long edges are connected with the short edges, an included angle between the long edge close to the base substrate and the short edge in the first cross section is a first included angle, and an included angle between the long edge away from the base substrate and the short side in the first section is a second included angle, the first included angle is in a range from 70 to 110 degrees, and/or the second included angle is in a range from 70 to 110 degrees.

For example, according to an embodiment of the disclosure, a second cross section of the second sub-structure taken by the plane along the arrangement direction of the adjacent sub-pixels and perpendicular to the base substrate comprises a rectangle or a trapezoid, and an included angle between a side edge of the trapezoid and a bottom edge of the trapezoid on a side away from the base substrate is not less than 70 degrees.

For example, according to an embodiment of the disclosure, a dimension of the protruding portion is not less than 0.01 micron in a direction parallel to the base substrate.

For example, according to an embodiment of the disclosure, a ratio of a thickness of the defining structure to a thickness of the light-emitting functional layer in the direction perpendicular to the base substrate is in a range from 0.7 to 1.5.

For example, according to an embodiment of the disclosure, in a direction perpendicular to the base substrate, a thickness of the second sub-structure is in a range from 100 to 10,000 angstroms, and a thickness of the first sub-structure is in a range from 100 to 10,000 angstroms.

For example, according to an embodiment of the disclosure, the second electrodes are continuously arranged at the defining structure.

For example, according to an embodiment of the disclosure, the second electrode is disconnected at an edge of the defining structure.

For example, according to an embodiment of the disclosure, the first electrode is in contact with a surface of the organic layer on a side away from the base substrate.

For example, according to an embodiment of the disclosure, the display substrate further comprises: a pixel defining pattern located at a side of the first electrode away from the base substrate, the pixel defining pattern located at least in the first display region comprising a plurality of first openings, one sub-pixel corresponding to at least one first opening, the light-emitting element of the sub-pixel at least partially located in the first opening corresponding to the sub-pixel, and the first opening being configured to expose the first electrode, wherein the pixel defining pattern further comprises a plurality of second openings, and at least a part of the defining structure is exposed by the second opening.

For example, according to an embodiment of the disclosure, the second opening exposes a part of the defining structure.

For example, according to an embodiment of the disclosure, at least one of the plurality of film layers of the light-emitting functional layer is disconnected at at least a part of an edge of the defining structure exposed by the second opening.

For example, according to an embodiment of the disclosure, the at least one of the plurality of film layers comprises a charge generation layer, and the light-emitting functional layer comprises a first light-emitting layer, the charge generation layer and a second light-emitting layer which are stacked, the charge generation layer is located between the first light-emitting layer and the second light-emitting layer, and the charge generation layer is disconnected at the defining structure.

For example, according to an embodiment of the disclosure, the film layer of the light-emitting functional layer on a side of the charge generation layer facing the base substrate is disconnected at the defining structure.

For example, according to an embodiment of the disclosure, a color of light emitted by the first light-emitting layer is the same as that of light emitted by the second light-emitting layer.

For example, according to an embodiment of the disclosure, the light-emitting functional layer comprises a light-emitting layer, and an area of an orthographic projection of at least one disconnected film layer in the light-emitting functional layer on the base substrate is larger than that of an orthographic projection of the light-emitting layer on the base substrate.

For example, according to an embodiment of the disclosure, the light-emitting functional layer comprises at least one light-emitting layer, and the film layers of the light-emitting functional layer disconnected at the defining structure comprise at least one light-emitting layer and at least one other film layer; an area of an orthogonal projection of the at least one other film layer disconnected on the base substrate is larger than that of the at least one light-emitting layer disconnected on the base substrate; or an area of a part of the at least one other film layer, which is disconnected, for covering the defining structure is larger than that of the at least one light-emitting layer, which is disconnected, for covering the defining structure.

For example, according to an embodiment of the disclosure, the second electrode and at least one of the plurality of film layers included in the light-emitting functional layer overlap with a projection of the defining structure on the base substrate.

For example, according to an embodiment of the disclosure, at least a part of the at least one of the plurality of film layers included in the light-emitting functional layer covers a part of a side surface of the defining structure.

For example, according to an embodiment of the disclosure, a thickness of a part of the second electrode overlapped with a projection of an edge of the defining structure on the base substrate is smaller than a thickness of at least a part of the second electrode not overlapped with the projection of the defining structure on the base substrate, and a thickness of a part of the charge generation layer overlapped with the projection of the edge of the defining structure on the base substrate is smaller than a thickness of a part of the charge generation layer not overlapped with the projection of the defining structure on the base substrate.

For example, according to an embodiment of the disclosure, the at least one of the plurality of film layers comprises a charge generation layer which is disconnected at at least a part of an edge of the defining structure, the second electrode covers a disconnected position of the charge generation layer, and a part of the second electrode located in the second opening comprises a first portion located on the defining structure and a second portion located at a position outside the defining structure, an orthographic projection of the first portion on the base substrate overlaps or connects with an orthographic projection of the second portion on the base substrate.

For example, according to an embodiment of the disclosure, a thickness of at least a part of the organic layer located in the second opening is greater than that of the organic layer located in the first opening.

For example, according to an embodiment of the disclosure, the base substrate further comprises a second display region, and the first display region surrounds at least a part of the second display region.

An embodiment of the disclosure provides a display substrate, comprising: a base substrate, comprising at least a first display region; a plurality of sub-pixels located in the first display region on the base substrate, each sub-pixel of at least a part of the plurality of sub-pixels comprising a light-emitting element, the light-emitting element comprising a light-emitting functional layer and a first electrode and a second electrode located on two sides of the light-emitting functional layer in a direction perpendicular to the base substrate, the first electrode being located between the light-emitting functional layer and the base substrate, and the light-emitting functional layer comprising a plurality of film layers, wherein a first orthographic projection of at least one of the plurality of film layers of the light-emitting functional layer on the base substrate is continuous, and a second orthographic projection on a plane perpendicular to the base substrate is discontinuous; or, both the first orthographic projection of at least one of the plurality of film layers of the light-emitting functional layer on the base substrate and the second orthographic projection of at least one of the plurality of film layers of the light-emitting functional layer on the plane perpendicular to the base substrate are discontinuous, and a width of an interval at a discontinuous position in the first orthographic projection is smaller than that in the second orthographic projection.

An embodiment of the disclosure provides a display device, comprising the display substrate according to any items mentioned above.

An embodiment of the disclosure provides a manufacturing method of a display substrate, comprising: forming a plurality of sub-pixels in at least a first display region on a base substrate, wherein forming the sub-pixels comprises sequentially forming a first electrode, a light-emitting functional layer and a second electrode which are stacked in a direction perpendicular to the base substrate; the manufacturing method further comprising: forming a first material layer on the base substrate; forming a second material layer on the first material layer, a material of the second material layer different from that of the first material layer; forming a defining structure by patterning the first material layer and the second material layer; wherein the first material layer is patterned to form a first sub-structure, and the second material layer is patterned to form a second sub-structure, the defining structure comprises the first sub-structure and the second sub-structure which are stacked, along an arrangement direction of adjacent sub-pixels, an edge of the second sub-structure of the defining structure located between the adjacent sub-pixels protrudes relative to an edge of the first sub-structure to form a protruding portion; or, a slope angle between at least a part of a side surface of the second sub-structure and a plane parallel to a contact surface of the first sub-structure and the second sub-structure is a first slope angle, and a slope angle between at least a part of a side surface of the first sub-structure and the plane parallel to the contact surface of the first sub-structure and the second sub-structure is a second slope angle, at least one of the first slope angle and the second slope angle is greater than 60 degrees, and an area of a surface of the second sub-structure close to the first sub-structure is not less than an area of the contact surface between the first sub-structure and the second sub-structure, the light-emitting functional layer is formed after the defining structure is formed, and the light-emitting functional layer comprises a plurality of film layers, at least one of the plurality of film layers is disconnected at the defining structure.

For example, according to an embodiment of the disclosure, forming the defining structure comprises etching a part of the first material layer directly below the second sub-structure to form the first sub-structure simultaneously with patterning the second material layer to form the second sub-structure.

For example, according to an embodiment of the disclosure, the second material layer is an inorganic nonmetal material layer, and the first material layer is an organic material layer, patterning the first material layer and the second material layer simultaneously to form the defining structure comprises: etching a part of the organic material layer directly below the second sub-structure by dry etching method to form the first sub-structure while etching the second material layer with the dry etching method to form the second sub-structure.

For example, according to an embodiment of the disclosure, both the second material layer and the first material layer are inorganic nonmaterial layers, and patterning the first material layer and the second material layer simultaneously to form the defining structure comprises: etching the first material layer and the second material layer by using an etching solution with different etching selectivity ratios with respect to the first and second material layers, wherein the etching selectivity ratio of the etching solution to the first material layer is larger than that of the etching solution to the second material layer, so that an edge of the first sub-structure formed by etching the first material layer is retracted relative to an edge of the second sub-structure formed by etching the second material layer, or, a slope angle of at least a part of a side surface of at least one of the first sub-structure and the second sub-structure is greater than 60 degrees.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
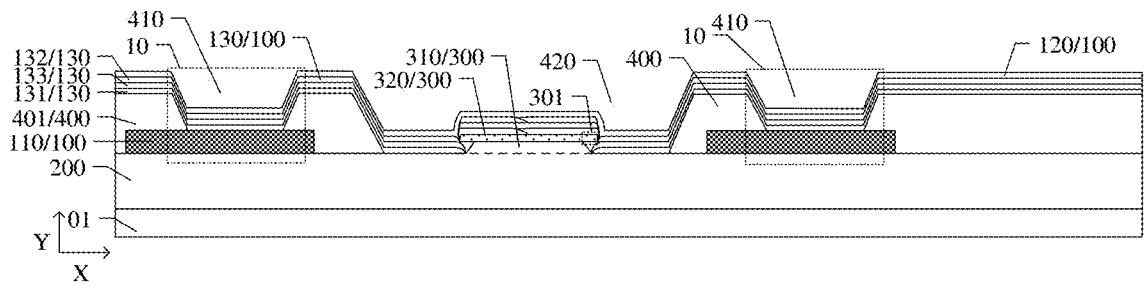
FIG. 1A and FIG. 1C are schematic diagrams of partial cross-sectional structures of a display substrate provided according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the invention. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

The features "parallel", "perpendicular" and "identical" as used in embodiments of the present disclosure include the features "parallel", "perpendicular" and "identical" in the strict sense, and "approximately parallel", "approximately perpendicular", "approximately identical", etc. including a certain amount of error, taking into account the measurement and the error associated with the measurement of a particular quantity (e.g. the limitations of the measurement system), within an acceptable range of deviation for a particular value as determined by a person of ordinary skill in the art. For example, "approximately" can mean within one or more standard deviations, or within 10% or 5% of the stated value. Where the number of a component is not specifically indicated in the context of an embodiment of the present disclosure, it means that the component may be one or more, or may be understood to be at least one. "At least one" means one or more, and "plurality" means at least two.

In the research, the inventor of the present disclosure found that the light-emitting functional layer can include a plurality of light-emitting layers which are stacked, at least two of the plurality of light-emitting layers are provided with a charge generation layer (CGL) therebetween, and the charge generation layer has a higher conductivity. In the case that the charge generation layer is an overall film layer, the charge generation layers of two adjacent organic light-emitting elements are continuous film layers, which easily leads to crosstalk between adjacent sub-pixels.

At least one embodiment of the present disclosure provides a display substrate, a manufacturing method thereof and a display device. The display substrate includes a base substrate and a plurality of sub-pixels located on the base substrate. The base substrate at least includes a first display region, and the plurality of sub-pixels are located in the first display region on the base substrate. Each sub-pixel of at least a part of sub-pixels includes an organic light-emitting element, the organic light-emitting element includes a light-emitting functional layer and a first electrode and a second electrode located on two sides of the light-emitting functional layer along a direction perpendicular to the base substrate, the first electrode is located between the light-emitting functional layer and the base substrate, and the light-emitting functional layer includes a plurality of film layers. The display substrate further includes a defining structure, at least one defining structure is arranged between at least two adjacent sub-pixels, and the defining structure includes a first sub-structure and a second sub-structure which are stacked, the first sub-structure is located between the second sub-structure and the base substrate, and the material of the first sub-structure is different from that of the second sub-structure; in an arrangement direction of adjacent sub-pixels, an edge of the second sub-structure of the defining structure between the adjacent sub-pixels protrudes relative to an edge of the first sub-structure to form a protruding portion, or, a slope angle between at least a part of a side surface of the second sub-structure and a plane parallel to a contact surface of the first sub-structure and the second sub-structure is a first slope angle, a slope angle between at least a part of the side surface of the first sub-structure and the plane parallel to the contact surface of the first sub-structure and the second sub-structure is a second slope angle, at least one of the first slope angle and the second slope angle is greater than 60 degrees, and an area of a surface of the second sub-structure close to the first sub-structure is not less than an area of the contact surface of the first sub-structure and the second sub-structure; at least one of the plurality of film layers is disconnected at the defining structure. According to embodiments of the present disclosure, by arranging the defining structure between adjacent sub-pixels in the display substrate, at least one of the plurality of film layers of the light-emitting functional layer can be disconnected at the defining structure of the second sub-structure, which is beneficial to reducing the probability of crosstalk between adjacent sub-pixels.

Hereinafter, the display substrate, the manufacturing method thereof and the display device provided by embodiments of the present disclosure will be described in detail with reference to the accompanying drawings.

Figure 1B:
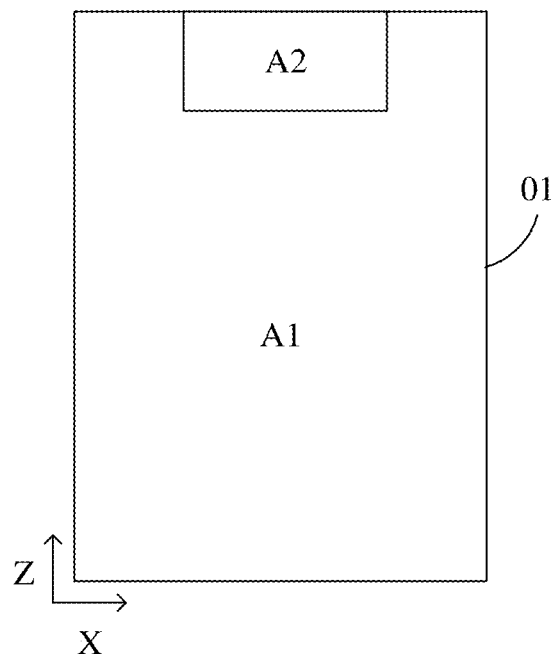
FIG. 1B is a plan view of a display substrate provided according to an embodiment of the present disclosure.
Figure 1C:
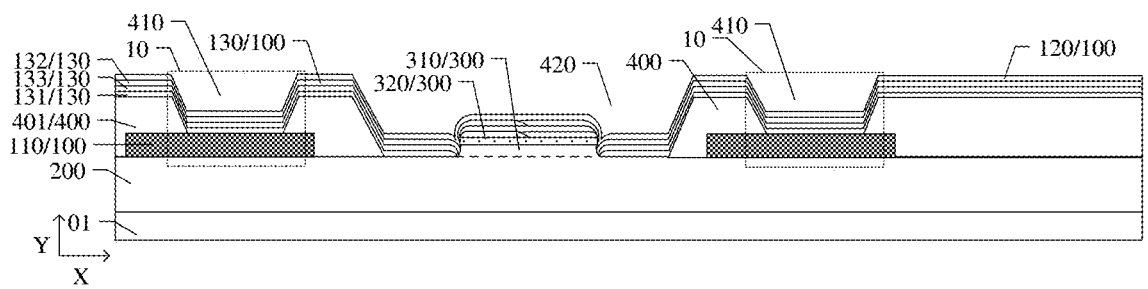

FIG. 1A and FIG. 1C are schematic diagrams of partial cross-sectional structures of a display substrate provided according to an embodiment of the present disclosure, FIG. 1B is a plan view of a display substrate provided according to an embodiment of the present disclosure. As illustrated in FIG. 1A and FIG. 1B, the display substrate includes a first display region A1 and a first display region A2 located on a base substrate 01. For example, the first display region A1 surrounds at least a part of the second display region A2. For example, the second display region A2 illustrated in FIG. 1B is located in the middle of the top of the base substrate 01, four sides of the rectangular first display region A1 may all surround the second display region A2, that is to say, the second display region A2 may be surrounded by the first display region A1. For example, the second display region A2 may not be located in the middle of the top of the base substrate 01 illustrated in FIG. 1B but may be located in other locations. For example, the second display region A2 may be located at the upper left corner or the upper right corner of the base substrate 01. For example, the first display region A1 can be a non-transparent display region, and the second display region A2 can be a transparent display region. Therefore, the display substrate can directly set the required hardware structures such as photosensitive sensors in the second display region A2 without digging holes, thus providing a foundation for realizing a full screen.

As illustrated in FIG. 1A and FIG. 1B, the display substrate includes the base substrate 01 and a plurality of sub-pixels 10 located on the base substrate 01, and the plurality of sub-pixels 10 are located in the first display region A1. Each sub-pixel 10 of at least a part of sub-pixels 10 includes a light-emitting element 100, the light-emitting element 100 includes a light-emitting functional layer 130 and a first electrode 110 and a second electrode 120 located on two sides of the light-emitting functional layer 130 along a direction perpendicular to the base substrate 01. The first electrode 110 is located between the light-emitting functional layer 130 and the base substrate 01, and the light-emitting functional layer 130 includes a plurality of film layers, for example, the light-emitting functional layer 130 includes a charge generation layer 133. For example, the light-emitting element 100 may be an organic light-emitting element.

As illustrated in FIG. 1A, the display substrate further includes a defining structure 300, at least one defining structure 300 is arranged between adjacent sub-pixels 10, and the defining structure 300 includes a first sub-structure 310 and a second sub-structure 320 which are stacked, the first sub-structure 310 is located between the second sub-structure 320 and the base substrate 01, and the materials of the first sub-structure 310 and the second sub-structure 320 are different. For example, the material of the second sub-structure 320 includes inorganic nonmetallic materials.

As illustrated in FIG. 1A, along an arrangement direction of adjacent sub-pixels 10 (X direction as illustrated in FIG. 1A), an edge of the second sub-structure 320 in the defining structure 300 between the adjacent sub-pixels 10 protrudes relative to an edge of the first sub-structure 310 to form a protruding portion 301, at least one of the plurality of film layers included in the light-emitting functional layer 130 is disconnected at the protruding portion 301. The light-emitting functional layer 130 is disconnected at the edge of the defining structure 300.

As illustrated in FIG. 1C, the display substrate includes a base substrate 01 and a plurality of sub-pixels 10 located on the base substrate 01, and the plurality of sub-pixels 10 are located in the first display region A1. Each sub-pixel 10 of at least a part of sub-pixels 10 includes a light-emitting element 100, the light-emitting element 100 includes a light-emitting functional layer 130 and a first electrode 110 and a second electrode 120 located on two sides of the light-emitting functional layer 130 in a direction perpendicular to the base substrate 01. The first electrode 110 is located between the light-emitting functional layer 130 and the base substrate 01, and the light-emitting functional layer 130 includes a plurality of film layers, for example, the light-emitting functional layer 130 includes a charge generation layer 133. For example, the light-emitting element 100 may be an organic light-emitting element.

As illustrated in FIG. 1C, the display substrate further includes a defining structure 300, at least one defining structure 300 is arranged between adjacent sub-pixels 10, and the defining structure 300 includes a first sub-structure 310 and a second sub-structure 320 which are stacked, the first sub-structure 310 is located between the second sub-structure 320 and the base substrate 01, and the materials of the first sub-structure 310 and the second sub-structure 320 are different. For example, the material of the second sub-structure 320 includes inorganic nonmetallic materials. A slope angle between at least a part of a side surface of the second sub-structure 320 and a plane parallel to a contact surface of the first sub-structure 310 and the second sub-structure 320 is a first slope angle, and a slope angle between at least a part of a side surface of the first sub-structure 310 and the plane parallel to the contact surface of the first sub-structure 310 and the second sub-structure 320 is a second slope angle, at least one of the first slope angle and the second slope angle is greater than 60 degrees, and an area of a surface of the second sub-structure 320 close to the first sub-structure 310 is not less than an area of the contact surface of the first sub-structure 310 and the second sub-structure 320; at least one of a plurality of film layers included in the light-emitting functional layer 130 is disconnected at the defining structure 300.

The first slope angle may be an included angle between a surface of the second sub-structure on a side away from the base substrate and the side surface of the second sub-structure, or an included angle between a surface of the second sub-structure on a side facing the base substrate and the side surface of the second sub-structure. The second slope angle may be an included angle between a surface of the first sub-structure on a side away from the base substrate and the side surface of the first sub-structure, or an included angle between a surface of the first sub-structure on a side facing the base substrate and the side surface of the first sub-structure. The side surface of the second sub-structure may relate to a surface of the second sub-structure with a certain included angle with the base substrate, and the side surface of the first sub-structure may relate to a surface of the first sub-structure with a certain included angle with the base substrate.

For example, at least one of the first slope angle and the second slope angle is greater than 70 degrees. For example, at least one of the first slope angle and the second slope angle is greater than 80 degrees. For example, at least one of the first slope angle and the second slope angle is greater than 90 degrees. For example, at least one of the first slope angle and the second slope angle is 70-120 degrees. For example, at least one of the first slope angle and the second slope angle is 80-110 degrees. For example, at least one of the first slope angle and the second slope angle is 90-100 degrees.

Figure 1D:
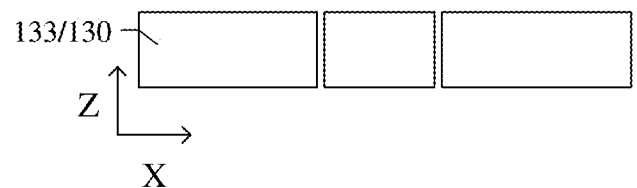
FIG. 1D is an orthographic projection of a part of a charge generation layer shown in FIG. 1C on the base substrate.

FIG. 1D is an orthographic projection of a part of the charge generation layer shown in FIG. 1C on the base substrate. As illustrated in FIG. 1C and FIG. 1D, the display substrate includes the base substrate 01 and the plurality of sub-pixels 10 located on the base substrate 01, and the plurality of sub-pixels 10 are located in the first display region A1. Each sub-pixel 10 of at least a part of sub-pixels 10 includes the light-emitting element 100, the light-emitting element 100 includes the light-emitting functional layer 130, the light-emitting element 100 includes the light-emitting functional layer 130 and the first electrode 110 and the second electrode 120 located on two sides of the light-emitting functional layer 130 in the direction perpendicular to the base substrate 01. The first electrode 110 is located between the light-emitting functional layer 130 and the base substrate 01, and the light-emitting functional layer 130 includes a plurality of film layers, for example, the light-emitting functional layer 130 includes a charge generation layer 133. For example, the light-emitting element 100 may be an organic light-emitting element.

As illustrated in FIG. 1C and FIG. 1D, a first orthographic projection of at least one of the plurality of film layers of the light-emitting functional layer 130 on the base substrate 01 is continuous, and a second orthographic projection of at least one of the plurality of film layers of the light-emitting functional layer 130 on a plane perpendicular to the base substrate 01 is discontinuous; or, both the first orthographic projection of at least one film layer of the light-emitting functional layer 130 on the base substrate 01 and the second orthographic projection of at least one of the plurality of film layers of the light-emitting functional layer 130 on the plane perpendicular to the base substrate 01 are discontinuous, and a width of an interval at a discontinuous position in the first orthographic projection is smaller than that in the second orthographic projection.

For example, as illustrated in FIG. 1C, at least one film layer of the light-emitting functional layer 130 may be the charge generation layer 133, and the first orthogonal projection of the charge generation layer 133 on the base substrate 01 is continuous, and a second orthogonal projection of the charge generation layer 133 on the plane perpendicular to the base substrate 01 is discontinuous. For example, the charge generation layer 133 may include a portion located on the defining structure 300 and a portion not located on the defining structure 300, the two portions are disconnected at an edge of the defining structure 300. For example, a first orthographic projection of the two portions on the base substrate 01 can be connected or overlapped, and the first orthographic projection is continuous. For example, in case that the distances between the two portions and the base substrate 01 are different, a second orthogonal projection of the two portions on a XY plane is discontinuous.

For example, as illustrated in FIG. 1C and FIG. 1D, at least one film layer of the light-emitting functional layer 130 may be the charge generation layer 133, both the first orthographic projection of the charge generation layer 133 on the base substrate 01 and the second orthographic projection on the plane perpendicular to the base substrate 01 are discontinuous, and a width of an interval at a discontinuous position in the first orthographic projection is smaller than that in the second orthographic projection. For example, the charge generation layer 133 may include the portion located on the defining structure 300 and the portion not located on the defining structure 300, the two portions are disconnected at the edge of the defining structure 300. For example, an interval is arranged between the first orthographic projection of the two portions on the base substrate 01, the first orthographic projection is disconnected. For example, in the case that the distances between the two portions and the base substrate 01 are different, the second orthographic projection of the two portions on the XY plane is discontinuous, an interval is arranged between the second orthographic projections of the two portions on the XY plane.

In the display substrate illustrated in FIG. 1A, the defining structure is arranged between adjacent sub-pixels, and the defining structure forms the protruding portion by setting the edge of the second sub-structure to protrude relative to the edge of the first sub-structure, so that at least one film layer of the light-emitting functional layer is disconnected at the protruding portion of the second sub-structure, which is beneficial to reducing the probability of crosstalk between adjacent sub-pixels.

In the display substrate illustrated in FIG. 1C, the defining structure is arranged between adjacent sub-pixels. By setting the slope angle of at least one of the first sub-structure and the second sub-structure, at least one film layer of the light-emitting functional layer is disconnected at the edge of the defining structure, which is beneficial to reducing the probability of crosstalk between adjacent sub-pixels.

For example, at least one film layer of the light-emitting functional layer can be disconnected at least at the edge of the defining structure, and the edge of the defining structure can be a protruding portion, or a part of two side surfaces with a larger slope angle.

The above-mentioned defining structure may relate to a structure for defining the distribution of at least one film layer of the light-emitting functional layer, for example, defining at least one film layer of the light-emitting functional layer disconnected at its edge.

"Adjacent sub-pixels" in any embodiment of the present disclosure means that no other sub-pixels 10 are arranged between two sub-pixels 10.

For example, as illustrated in FIG. 1A and FIG. 1C, the plurality of sub-pixels 10 may include two adjacent sub-pixels 10 arranged in the X direction. For example, at least one edge of the second sub-structure 320 protrudes relative to the corresponding edge of the first sub-structure 310 to form at least one protruding portion 301. For example, as illustrated in FIG. 1A, both two edges of the second sub-structure 320 protrude relative to the corresponding edges of the first sub-structure 310 to form two protruding portions 301. For example, the two protruding portions 301 are arranged in the X direction.

FIG. 1A and FIG. 1C schematically show that one defining structure 300 is arranged between two adjacent sub-pixels 10, and the defining structure 300 includes two protruding portions 301, but it is not limited thereto. Two or more defining structures may be arranged between two adjacent sub-pixels, and each defining structure includes at least one protruding portion. By setting the number of defining structures and the number of protruding portions, at least one film layer of the light-emitting functional layer can be disconnected by the defining structure.

For example, as illustrated in FIG. 1A and FIG. 1C, an orthographic projection of a surface of the first sub-structure 310 facing the second sub-structure 320 on the base substrate 01 is completely located in an orthographic projection of a surface of the second sub-structure 320 facing the base substrate 01 on the base substrate 01. For example, the dimension of the second sub-structure 320 in the X direction is larger than the dimension of the surface of the first sub-structure 310 facing the second sub-structure 320 in the X direction.

For example, as illustrated in FIG. 1A and FIG. 1C, the thickness of the first sub-structure 310 is greater than that of the second sub-structure 320 in the direction perpendicular to the base substrate 01.

For example, as illustrated in FIG. 1A and FIG. 1C, the light-emitting functional layer 130 may include a first light-emitting layer (EML) 131, a charge generation layer (CGL) 133 and a second light-emitting layer 132 which are stacked, and the charge generation layer 133 is located between the first light-emitting layer 131 and the second light-emitting layer 132. The charge generation layer has stronger conductivity, which can make the light-emitting functional layer have the advantages of long life, low power consumption and high brightness. For example, compared with the light-emitting functional layer without the charge generation layer, the light-emitting brightness of sub-pixels can be nearly doubled by setting the charge generation layer in the light-emitting functional layer.

For example, in each sub-pixel 10, the light-emitting functional layer 130 may further include a hole injection layer (HIL), a hole transport layer (HTL), an electron transport layer (ETL) and an electron injection layer (EIL)

For example, the hole injection layer, the hole transport layer, the electron transport layer, the electron injection layer and the charge generation layer 133 are all common film layers of the plurality of sub-pixels 10, and can be called common layers. For example, at least one film layer of the light-emitting functional layer 130 that is disconnected at the edge of the defining structure 300 may be at least one film layer among the above common layers. By cutting off at least one film layer of the common layers at the edge of the defining structure 300 between adjacent sub-pixels, it can be beneficial to reducing the probability of crosstalk between adjacent sub-pixels.

For example, the second light-emitting layer 132 may be located between the first light-emitting layer 131 and the second electrode 120, and the hole injection layer may be located between the first electrode 110 and the first light-emitting layer 131. For example, an electron transport layer may be arranged between the charge generation layer 133 and the first light-emitting layer 131. For example, a hole transport layer may be arranged between the second light-emitting layer 132 and the charge generation layer 133. For example, an electron transport layer and an electron injection layer may be arranged between the second light-emitting layer 132 and the second electrode 120.

For example, the first light-emitting layer 131 and the second light-emitting layer 132 of a same sub-pixel 10 may be light-emitting layer layers that emit light of a same color. For example, the first light-emitting layers 131 (or the second light-emitting layers 132) of the sub-pixels 10 that emit light of different colors emit light of different colors. Of course, the embodiments of the present disclosure are not limited thereto. For example, the first light-emitting layer 131 and the second light-emitting layer 132 of a same sub-pixel 10 can be light-emitting layers emitting light of different colors. By setting light-emitting layers of a same sub-pixel 10 emitting light of different colors, the light emitted by multiple light-emitting layers included in the sub-pixel 10 can be mixed into white light, and the color of the light emitted from each sub-pixel can be adjusted by setting a color film layer.

For example, as illustrated in FIG. 1A and FIG. 1C, the first light-emitting layers 131 (the second light-emitting layers 132) of adjacent sub-pixels may overlap on the defining structure 300. However, it is not limited thereto. For example, the first light-emitting layers 131 (the second light-emitting layers 132) of adjacent sub-pixels may be spaced apart from each other on the defining structure 300; alternatively, only the first light-emitting layer 131 (the second light-emitting layer 132) of one sub-pixel of adjacent sub-pixels may be arranged on the defining structure 300.

For example, the light light-emitting layers located on a same side of the charge generation layers 133 of adjacent sub-pixels 10 may be spaced apart from each other, or may overlap or connect at the interval between the two sub-pixels 10, which is not limited by the embodiment of the present disclosure.

For example, the material of the electron transport layer may include aromatic heterocyclic compounds, for example imidazole derivatives such as benzimidazole derivatives, imidazopyridine derivatives, benzimidazole phenanthridine derivatives or the like; triazine derivatives such as pyrimidine derivatives and triazine derivatives or the like; quinoline derivatives, isoquinoline derivatives, phenanthroline derivatives and other compounds containing nitrogen-containing six-membered ring structure (including compounds with phosphine oxide substituents on heterocycles) or the like.

For example, a material of the charge generation layer 133 may be the material containing phosphorus oxygen groups or the material containing triazine.

For example, a ratio of an electron mobility of the charge generation layer 133 to an electron mobility of the electron transport layer is 10-2 to 102.

For example, in the case that the defining structure 300 is not provided between the above two adjacent sub-pixels 10, the common layers such as the charge generation layer 133 of the light-emitting functional layer 130 of the two adjacent sub-pixels 10 may be connected or be an overall film layer. For example, the charge generation layer 133 has a higher conductivity, and the high conductivity of the charge generation layer 133 easily leads to crosstalk between adjacent sub-pixels 10 for a display device with high resolution.

In the display substrate provided by the embodiments of the present disclosure, by arranging the defining structure between the two adjacent sub-pixels, at least one film layer of the light-emitting functional layer formed at the edge of the defining structure can be disconnected, in this case, at least one film layer (such as the charge generation layer) of the light-emitting functional layer of the two adjacent sub-pixels includes portions spaced apart from each other, which can increase the resistance of the light-emitting functional layer between the adjacent sub-pixels, thereby reducing the probability of crosstalk between two adjacent sub-pixels while not affecting the normal display of sub-pixels.

For example, as illustrated in FIG. 1A, the material of the second sub-structure 320 may include any one or more selected from the group consisting of silicon nitride, silicon oxide or silicon oxynitride.

For example, as illustrated in FIG. 1A, the second electrodes 120 of the plurality of sub-pixels 10 may be a common electrode shared by the plurality of sub-pixels 10, and in the case that the defining structure 300 is not provided between the two adjacent sub-pixels 10, the second electrodes 120 are an overall film layer.

For example, as illustrated in FIG. 1A, the dimension of the protruding portion 301 may be in a range from 0.1 to 5 microns. For example, the dimension of the protruding portion 301 may be in a range from 0.2 to 2 microns.

For example, as illustrated in FIG. 1A, in the direction perpendicular to the base substrate 01, a ratio of a thickness of the defining structure 300 to a thickness of the light-emitting functional layer 130 is in a range from 0.7 to 1.5. For example, the ratio of the thickness of the defining structure 300 to the thickness of the light-emitting functional layer 130 is in a range from 0.8 to 1.2. For example, the ratio of the thickness of the defining structure 300 to the thickness of the light-emitting functional layer 130 is in a range from 0.9 to 1.1. For example, in the direction perpendicular to the base substrate 01, a thickness of the second sub-structure 320 may be in a range from 100 to 10,000 angstroms. For example, the thickness of the second sub-structure 320 may be in a range from 200 to 1500 angstroms. For example, in the direction perpendicular to the base substrate 01, a thickness of the first sub-structure 310 may be in a range from 100 to 10,000 angstroms. For example, the thickness of the first sub-structure 310 may be in a range from 200 to 2000 angstroms. An example of embodiments of the present disclosure can set the thickness of the defining structure, for example, the ratio of the thickness of the defining structure to the thickness of the light-emitting functional layer is set to be in a range from 0.7 to 1.5, so that the light-emitting functional layer 130 is disconnected at the edge of the defining structure 300, and the second electrodes 120 are continuous without being interrupted, thereby preventing the crosstalk between adjacent sub-pixels, and meanwhile ensuring the uniformity of display with the second electrodes uninterrupted.

For example, the thickness of the defining structure 300 may be in a range from 300 to 5000 angstroms, and the above-mentioned thickness (300-5000 angstroms) of the defining structure 300 can make the light-emitting functional layer 130 inevitably disconnected at the edge of the defining structure, and whether the second electrode 120 is disconnected is further determined according to the thickness of the defining structure 300.

According to embodiments of the present disclosure, by setting the thickness of the defining structure and the dimension of the protruding portion, at least one film layer of the light-emitting functional layer can be disconnected at the edge of the limiting structure. For example, the light-emitting functional layer 130 includes at least one light-emitting layer, and the film layers of the light-emitting functional layer 130 disconnected at the defining structure 300 include at least one light-emitting layer and at least one other film layer. An area of an orthogonal projection of the at least one other film layer disconnected on the base substrate 01 is larger than that of the at least one light-emitting layer disconnected on the base substrate 01; alternatively, an area of a part of the at least one other film layer, which is disconnected, for covering the defining structure 300 is larger than that of the at least one light-emitting layer, which is disconnected, for covering the defining structure 300.

For example, projections of the second electrode 120 and at least one of the plurality of film layers included in the light-emitting functional layer 130 overlap with a projection of the defining structure 300 on the base substrate 01.

For example, at least a part of the at least one of the plurality of film layers included in the light-emitting functional layer 130 covers a part of the side surface of the defining structure 300.

For example, a thickness of a part of the second electrode 120 overlapped with a projection of the edge of the defining structure 300 on the base substrate 01 is smaller than a thickness of at least a part of the second electrode 120 not overlapped with a projection of the defining structure 300 on the base substrate 01, and a thickness of a part of the charge generation layer 133 overlapped with the projection of the edge of the defining structure 300 on the base substrate 01 is smaller than a thickness of a part of the charge generation layer 133 not overlapped with the projection of the defining structure 300 on the base substrate 01.

Figure 2:
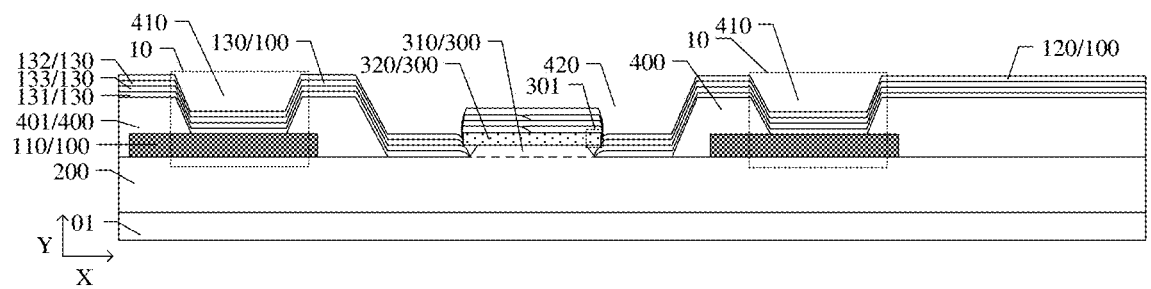
FIG. 2 is a schematic diagram of a partial cross-sectional structure of a display substrate provided according to another example of an embodiment of the present disclosure.

FIG. 2 is a schematic diagram of a partial cross-sectional structure of a display substrate provided according to another example of an embodiment of the present disclosure. The display substrate in the example illustrated in FIG. 2 differs from the display substrate in the example illustrated in FIG. 1A in that the thickness of the defining structures are different. The thickness of the defining structure 300 in the display substrate illustrated in FIG. 2 is larger than that of the defining structure 300 in the display substrate illustrated in FIG. 1A. For example, as illustrated in FIG. 2, by setting the thickness of the limiting structure 300 larger (for example, the ratio of the thickness of the defining structure to the thickness of the light-emitting functional layer is greater than 1.5), both the light-emitting functional layer and the second electrode are disconnected at the protruding portion of the defining structure.

For example, FIG. 1A schematically illustrates that all the film layers included in the light-emitting functional layer 130 are disconnected at the protruding portion 301 of the defining structure 300, and the second electrode 120 is not disconnected at the protruding portion 301 of the defining structure 300. However, it is not limited thereto, in other examples, by setting the thickness of the defining structure, a part of the film layers of the light-emitting functional layer close to the base substrate are disconnected at the edge of the defining structure, a part of the film layers of the light-emitting functional layer away from the base substrate are not disconnected at the edge of the defining structure, and the second electrode is not disconnected at the edge of the defining structure.

For example, as illustrated in FIG. 1A, the material of the first sub-structure 310 includes an organic material.

For example, as illustrated in FIG. 1A, the display substrate further includes an organic layer 200 located between the second sub-structure 320 and the base substrate 01.

For example, as illustrated in FIG. 1A, the first sub-structure 310 is an integrated structure with the organic layer 200. For example, the first sub-structure 310 may be a part of the organic layer 200. For example, the first sub-structure 310 may be a part of the organic layer 200 protruding to a side away from the base substrate 01.

For example, as illustrated in FIG. 1A, the organic layer 200 includes a planarization (PLN) layer. For example, the material of the first sub-structure 310 includes photoresist, polyimide (PI) resin, acrylic resin, silicon compound or polyacrylic resin.

For example, as illustrated in FIG. 1A, a first cross section of the first sub-structure 310, which is taken by a plane along the arrangement direction of adjacent sub-pixels 10 and perpendicular to the base substrate 01, includes a rectangle. For example, the first cross section of the first sub-structure 310, which is taken by the plane along the arrangement direction of adjacent sub-pixels 10 and perpendicular to the base substrate 01, includes a trapezoid. For example, the first cross section includes two short edges and two long edges extending in a direction parallel to the base substrate 01, the long edges are connected with the short edges, an included angle between the long edge close to the base substrate 01 and the short edge of the first cross section is a first included angle, and an included angle between the long edge away from the base substrate 01 and the short edge of the first cross section is a second included angle. The first included angle is 70-110 degrees, and/or the second included angle is 70-110 degrees.

For example, the first cross section may be a trapezoid, and an included angle between a side edge of the trapezoid and the bottom of the trapezoid close to the base substrate 01 is not more than 90 degrees. For example, as illustrated in FIG. 1A, the first cross section of the first sub-structure 310, which is taken by a plane parallel to the XY plane, may be a trapezoid, with an upper bottom of the trapezoid located on a side of a lower bottom of the trapezoid away from the base substrate 01, and an included angle between a side edge of the trapezoid and the lower bottom is not more than 90 degrees.

For example, as illustrated in FIG. 1A, a length of the upper bottom of the trapezoidal cross section of the first sub-structure 310 is smaller than a length of an edge of the cross section of the second sub-structure 320 close to the base substrate 01 so that the edge of the second sub-structure 320 and an edge of the upper bottom of the first sub-structure 310 form an undercut structure, that is to say, the edge of the second sub-structure 320 includes the protruding portion 301.

FIG. 1A schematically illustrates that the side edge of the first sub-structure 310 is a straight edge, but it is not limited thereto. In the actual process, the side edge of the formed first sub-structure 310 may also be a curved edge, for example, the curved edge is curved to a side away from a center of the first sub-structure 310 where it is located, alternatively, the curved edge is curved to a side close to the center of the first sub-structure 310 where it is located, in this case, a slope angle between the curved edge and the lower bottom of the first sub-structure 310 may refer to an included angle between the lower bottom and a tangent line at the midpoint of the curved edge, or an included angle between the lower bottom and a tangent line at an intersection of the curved edge and the lower bottom. For example, a slope angle between the curved edge and the upper bottom of the first sub-structure 310 may refer to an included angle between the upper bottom and a tangent line at the midpoint of the curved edge, or an included angle between the lower bottom and a tangent line at an intersection of the curved edge and the upper bottom.

For example, as illustrated in FIG. 1A, a second cross section of the second sub-structure 320, which is taken by the plane along the arrangement direction of adjacent sub-pixels 10 and perpendicular to the base substrate 01, includes a rectangle or a trapezoid. For example, FIG. 1A schematically illustrates that a shape of the second cross section of the second sub-structure 320 is a rectangle. By setting an included angle between a short edge and a long edge of the second cross section of the second sub-structure 320 close to the base substrate 01 to be a right angle or an approximately right angle (for example, the approximately right angle can mean that the difference between the included angle between the two edges and 90 degrees is not more than 10 degrees), it can be beneficial for the light-emitting functional layer 130 to be disconnected at the edge of the second sub-structure 320.

For example, the shape of the second cross section of the second sub-structure 320, which is taken by the plane along the arrangement direction of adjacent sub-pixels and perpendicular to the base substrate 01, may be a trapezoid, and an included angle between a side edge of the trapezoid and the bottom edge of the trapezoid on a side away from the base substrate 01 is not less than 70 degrees. According to the embodiment of the present disclosure, the included angle between the side edge of the second sub-structure 320 and the bottom edge of the trapezoid on the side away from the base substrate can be set, so that the light-emitting functional layer 130 is disconnected at the edge of the second sub-structure 320.

For example, the shape of the second cross section of the second sub-structure 320 may be a trapezoid, and the length of the bottom edge of the trapezoid on the side away from the base substrate 01 is smaller than the length of the bottom edge of the trapezoid on the side close to the base substrate 01.

Figure 3A:
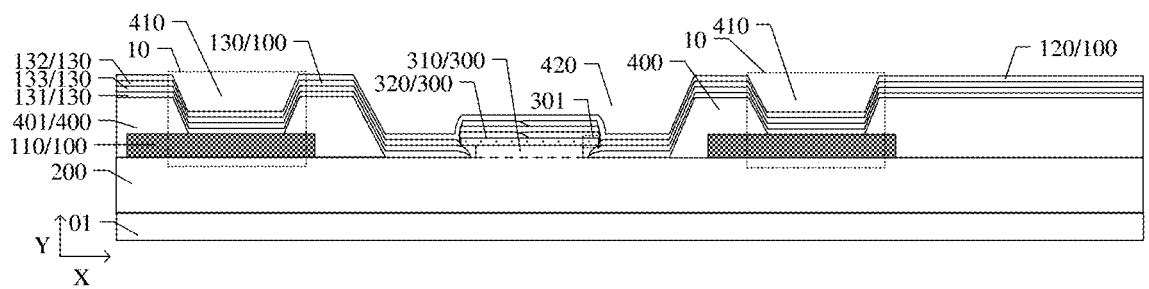
FIG. 3A is a schematic diagram of a partial cross-sectional structure of a display substrate provided according to another example of an embodiment of the present disclosure.

FIG. 3A is a schematic diagram of a partial cross-sectional structure of a display substrate provided according to another example of an embodiment of the present disclosure. The display substrate illustrated in FIG. 3A differs from the display substrate illustrated in FIG. 1A in that the shape of the first cross section of the first sub-structure 310 taken by the plane along the arrangement direction of adjacent sub-pixels 10 and perpendicular to the base substrate 01 is different. For example, as illustrated in FIG. 3A, the shape of the first cross section of the first sub-structure 310 taken by a plane parallel to the XY plane may be a rectangle, and the shape of the first cross section of the second sub-structure 320 taken by the plane parallel to the XY plane may also be a rectangle, which may facilitate the disconnection of the light-emitting functional layer 130 at the edge of the defining structure 300.

Figure 3B:
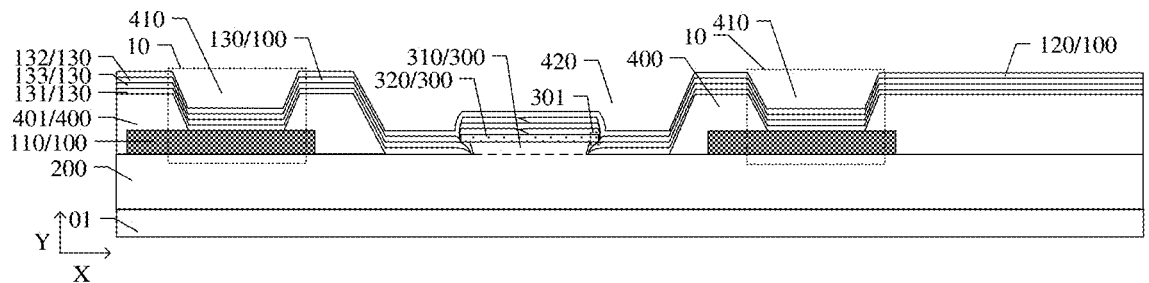
FIG. 3B is a schematic diagram of a partial cross-sectional structure of a display substrate provided according to another example of an embodiment of the present disclosure.

FIG. 3B is a schematic diagram of a partial cross-sectional structure of a display substrate provided according to another example of an embodiment of the present disclosure. The display substrate illustrated in FIG. 3B differs from the display substrate illustrated in FIG. 3A in that the shape of the first cross section of the first sub-structure 310 taken by the plane along the arrangement direction of adjacent sub-pixels 10 and perpendicular to the base substrate 01 is different. For example, as illustrated in FIG. 3B, the shape of the first cross section of the first sub-structure 310 taken by the plane parallel to the XY plane may be a trapezoid, and a length of the bottom edge of the trapezoid on a side away from the base substrate 01 is larger than that of the trapezoid on a side close to the base substrate 01, which may facilitate the disconnection of the light-emitting functional layer 130 at the edge of the defining structure 300.

For example, as illustrated in FIG. 1A to FIG. 3B, the first electrode 110 is in contact with a side surface of the organic layer 200 away from the base substrate 01. For example, the first electrode 110 may be an anode and the second electrode 120 may be a cathode. For example, the cathode can be made of a material with high conductivity and low work function, and for example, the cathode can be made of a metal material. For example, the anode can be made of a transparent conductive material with a high work function.

For example, as illustrated in FIG. 1A to FIG. 3B, the display substrate further includes a pixel defining pattern 400 located on a side of the first electrode 110 away from the base substrate 01. The pixel defining pattern 400 located at least in the first display region A1 includes a plurality of first openings 410, one sub-pixel corresponds to at least one first opening 410, and the light-emitting elements of the sub-pixels are at least partially located in the first openings 410 corresponding to the sub-pixels, and the first openings 410 are configured to expose the first electrodes 110. For example, if the light-emitting functional layer 130 is formed in the first opening 410 of the pixel defining pattern 400, the first electrode 110 and the second electrode 120 on two sides of the light-emitting functional layer can drive the light-emitting functional layer 130 in the first opening 410 to emit light. For example, the above-mentioned light-emitting region may relate to a region where sub-pixels effectively emit light, and a shape of the light-emitting region relates to a two-dimensional shape, for example, the shape of the light-emitting region may be the same as the shape of the first opening 410 of the pixel defining pattern 400.

For example, as illustrated in FIG. 1A to FIG. 3B, a part of the pixel defining pattern 400 except the first openings 410 is a pixel define portion 401, and the material of the pixel define portion 401 may include polyimide, acrylic or polyethylene terephthalate or the like.

For example, as illustrated in FIG. 1A to FIG. 3B, the pixel defining pattern 400 further includes a plurality of second openings 420 in which the defining structures 300 are located. For example, an interval is provided between the defining structure 300 and the pixel define portion 401 of the pixel defining pattern 400.

For example, as illustrated in FIG. 1A to FIG. 3B, a dimension of the first opening 410 may be smaller than that of the second opening 420 along the X direction. However, it is not limited thereto, and the dimension of the second opening can be set according to the product requirements.

For example, as illustrated in FIG. 1A to FIG. 3B, the second sub-structure 320 includes at least one partition layer. For example, the second sub-structure 320 may include one partition layer, the material of the partition layer may be silicon oxide or silicon nitride. For example, the second sub-structure 320 may include two partition layers, the materials of the two partition layers are silicon oxide and silicon nitride, respectively. The embodiments of the present disclosure are not limited thereto, and the second sub-structure may include three or more partition layers, and the number of partition layers included in the second sub-structure may be set according to product requirements.

For example, as illustrated in FIG. 1A to FIG. 3B, the thickness of the defining structure 300 is smaller than that of the pixel define portion 401 in the direction perpendicular to the base substrate 01.

For example, as illustrated in FIG. 1A to FIG. 3B, the dimension of the protruding portion 301 is not less than 0.01 micron in the direction parallel to the base substrate 01. For example, the dimension of the protruding portion 301 is not less than 0.1 micron in the direction parallel to the base substrate 01. For example, the dimension of the protruding portion 301 may be in a range from 0.01 to 5 microns in the direction parallel to the base substrate 01. For example, the dimension of the protruding portion 301 may be in a range from 0.05 to 4 microns in the direction parallel to the base substrate 01. For example, the dimension of the protruding portion 301 may be in a range from 0.1 to 2 microns in the direction parallel to the base substrate 01.

For example, as illustrated in FIG. 1A to FIG. 3B, the second cross section of the second sub-structure 320, which is taken by the plane along the arrangement direction of adjacent sub-pixels 10 and perpendicular to the base substrate 01, includes a rectangle or a trapezoid. For example, the shape of the second cross section of the second sub-structure 320 is a rectangle, by setting an included angle between a short edge and a long edge of the second cross section of the second sub-structure 320 close to the base substrate 01 to be a right angle or an approximately right angle (for example, an approximately right angle can mean that the difference between the included angle between the two edges and 90 degrees is not more than 10 degrees), it can be beneficial for the light-emitting functional layer 130 to be disconnected at the edge of the second sub-structure 320.

For example, the second cross section of the second sub-structure 320 may be a trapezoid, and the included angle between the side edge of the trapezoid and the bottom edge of the trapezoid on the side close to the base substrate 01 is not less than 70 degrees. For example, the second cross section may be a trapezoid, and the included angle between the side edge of the trapezoid and the bottom edge of the trapezoid on the side close to the base substrate 01 is not less than 90 degrees, so that the included angle between the side edge of the second sub-structure 320 and the bottom edge of the trapezoid on the side away from the base substrate 01 is an acute angle, which can facilitate the light-emitting functional layer 130 to be disconnected at the edge of the defining structure 300.

For example, as illustrated in FIG. 1A to FIG. 3B, the film layer(s) of the light-emitting functional layer 130 on a side of the charge generation layer 133 facing the base substrate 01 is/are disconnected at the edge of the defining structure 300. For example, the film layers on the side of the charge generation layer 133 facing the base substrate 01 may include an electron transport layer, a first light-emitting layer 131 or the like.

For example, as illustrated in FIG. 1A to FIG. 3B, the light-emitting functional layer 130 includes the light-emitting layer (the first light-emitting layer 131 or the light-emitting layer 132), and an area of an orthographic projection of the disconnected film layer in the light-emitting functional layer 130 on the base substrate 01 is larger than that of the light-emitting layer (the first light-emitting layer 131 or the second light-emitting layer 132) of any sub-pixel on the base substrate 01. For example, the disconnected film layer may be the above common layer, and the light-emitting layer may be a film layer with a certain pattern formed by using a fine metal mask.

For example, as illustrated in FIG. 1A to FIG. 3B, the light-emitting layer (the first emissive 131 or the second light-emitting layer 132) of a sub-pixel is disconnected at the edge of the defining structure 300, and the area of the orthographic projection of the other film layer of the disconnected film layers except the disconnected light-emitting layer (the first light-emitting layer 131 or the second light-emitting layer 132) in the light-emitting functional layer 130 on the base substrate 01 is larger than that of the disconnected light-emitting layer (the first light-emitting layer 131 or the second light-emitting layer 132).

For example, as illustrated in FIG. 1A to FIG. 3B, the second electrode 120 and at least the charge generation layer 133 included in the light-emitting functional layer 130 are disposed on the defining structure 300, and at least a part of the charge generation layer 133 covers a part of the side surface of the defining structure 300. For example, at least a part of the charge generation layer 133 located on the defining structure 300 may cover a part of the side surface of the second sub-structure 320. For example, at least a part of the charge generation layer 133 not located on the defining structure 300 may cover a part of the side surface of the first sub-structure 310.

For example, as illustrated in FIG. 1A to FIG. 3B, a thickness of a part of the second electrode 120 located at a center of the defining structure 300 is greater than that of a part of the second electrode 200 located at an edge of the defining structure 300, and a thickness of a part of the charge generation layer 133 located at the center of the defining structure 300 is greater than that of a part of the charge generation layer 133 located at the edge of the defining structure 300. For example, a thickness of a middle part of the second electrode 120 located on the defining structure 300 is greater than that of two sides of the second electrode 120. For example, a thickness of a middle part of the charge generation layer 133 located on the defining structure 300 is larger than that of two sides of the charge generation layer 133.

For example, as illustrated in FIG. 1A to FIG. 3B, the second electrode 120 is in contact with the side surface of the defining structure 300. For example, the second electrode 120 may be in contact with the side surface of the first sub-structure 310, and/or the second electrode 120 may be in contact with the side surface of the second sub-structure 320.

For example, as illustrated in FIG. 1A to FIG. 3B, the charge generation layer 133 is disconnected at the edge of the defining structure 300, the second electrode 120 covers a disconnected position of the charge generation layer 133, and a part of the second electrode 120 located in the second opening 420 includes a first portion located on the defining structure 300 and a second portion located at a position outside the defining structure 300, and an orthographic projection of the first portion on the base substrate 01 overlaps or connects with the orthographic projection of the second portion on the base substrate 01.

For example, as illustrated in FIG. 1A to FIG. 3B, a thickness of at least a part of the organic layer 200 located in the second opening 420 is greater than that of the organic layer 200 located in the first opening 410. For example, a portion of the organic layer 200 with a larger thickness located in the second opening 420 may include a portion of the defining structure 300.

For example, the display substrate further includes a pixel circuit, and the first electrode 110 of the organic light-emitting element 100 can be connected to one of a source electrode and a drain electrode of a thin film transistor in the pixel circuit through a via hole penetrating through a film layer such as the organic layer 200. For example, the pixel circuit further includes a storage capacitor. For example, a gate insulating layer, an interlayer insulating layer, various film layers in the pixel circuit, data lines, gate lines, power signal lines, reset power signal lines, reset control signal lines, light emission control signal lines and other film layers or structures may be provided between the organic layer 200 and the base substrate 01. For example, the film layer(s) between the organic layer 200 and the base substrate 01 may include one layer of power signal line or two layers of power signal lines. For example, a surface of the organic layer 200 at a side facing the base substrate 01 may be in contact with the interlayer insulating layer.

For example, a side of the pixel define portion 401 of the pixel defining pattern 400 away from the base substrate 01 may further be provided with a spacer configured to support an evaporation mask for manufacturing the light-emitting layer.

For example, an embodiment of the present disclosure provides a manufacturing method for forming the display substrate illustrated in FIG. 1A, which includes forming a plurality of sub-pixels 10 on a base substrate 01, wherein forming the sub-pixels 10 includes sequentially forming a first electrode 110, a light-emitting functional layer 130 and a second electrode 120 which are stacked in a direction perpendicular to the base substrate 01; forming a first material layer on the base substrate 01; forming a second material layer on the first material layer, wherein a material of the second material layer is different from that of the first material layer; forming a defining structure 300 by patterning the first material layer and the second material layer. The first material layer is patterned to form a first sub-structure 310, and the second material layer is patterned to form a second sub-structure 320. The defining structure 300 includes the first sub-structure 310 and the second sub-structure 320 which are stacked. In an arrangement direction of adjacent sub-pixels, an edge of the second sub-structure 320 of the defining structure 300 located between the adjacent sub-pixels protrudes relative to an edge of the first sub-structure 310 to form the protruding portion 301; or, a slope angle between at least a part of a side surface of the second sub-structure 320 and a plane parallel to a contact surface of the first sub-structure 310 and the second sub-structure 320 is a first slope angle, and a slope angle between at least a part of a side surface of the first sub-structure 310 and the plane parallel to the contact surface of the first sub-structure 310 and the second sub-structure 320 is a second slope angle, at least one of the first slope angle and the second slope angle is greater than 60 degrees, and an area of a surface of the second sub-structure 320 close to the first sub-structure 310 is not less than an area of the contact surface between the first sub-structure 310 and the second sub-structure 320. The light-emitting functional layer 130 is formed after the defining structure 300 is formed, and the light-emitting functional layer 130 includes a plurality of film layers, at least one of which is disconnected at an edge of the defining structure 300.

For example, forming the defining structure 300 includes that a part of the first material layer directly below the second sub-structure 320 is etched to form the first sub-structure 310 while patterning the second material layer to form the second sub-structure 320.

For example, the second material layer is an inorganic nonmetal material layer, and the first material layer is an organic material layer. Patterning the first material layer and the second material layer simultaneously to form the defining structure 300 includes: a part of the organic material layer directly below the second sub-structure 320 is dry etched to form the first sub-structure 310 while etching the second material layer with a dry etching method to form the second sub-structure 320.

Figure 3C:
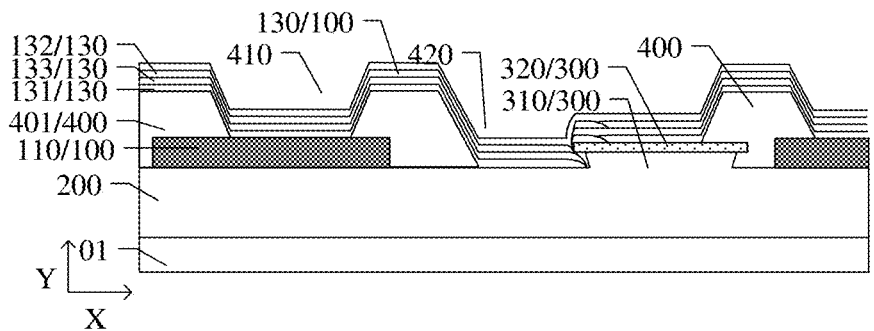
FIG. 3C is a schematic diagram of a partial cross-sectional structure of a display substrate provided according to another example of an embodiment of the present disclosure.

FIG. 3C is a schematic diagram of a partial cross-sectional structure of a display substrate provided according to another example of an embodiment of the present disclosure. A difference between the display substrate illustrated in FIG. 3C and the display substrate illustrated in FIG. 3B is a part of the defining structure 300 exposed by the second opening 420. For example, as illustrated in FIG. 3C, the pixel define portion 401 covers a part of the defining structure 300, and the second opening 420 exposes another part of the defining structure 300.

For example, as illustrated in FIG. 3C, at least one of the plurality of film layers of the light-emitting functional layer 130 is disconnected at at least a part of the edge of the defining structure 300 exposed by the second opening 420. For example, at least one of the plurality of film layers of the light-emitting functional layer 130 is disconnected at an edge of the defining structure 300 exposed by the second opening 420. For example, in two adjacent sub-pixels, the light-emitting layer (such as the first light-emitting layer or the second light-emitting layer) of each sub-pixel includes a portion located on the defining structure 300, but it is not limited thereto, and it is also possible that only the light-emitting layer in the sub-pixel closer to the defining structure 300 includes a portion located on the defining structure, while the light-emitting layer in the sub-pixel farther from the defining structure 300 does not include a portion located on the defining structure.

For example, FIG. 4A to FIG. 4D are flow charts of a manufacturing method of the display substrate before the display substrate formed shown in FIG. 1A. As illustrated in FIG. 1A, 4A to FIG. 4D, the manufacturing method of the display substrate includes: forming the plurality of sub-pixels 10 on the base substrate 01, wherein forming the sub-pixels 10 includes sequentially forming the first electrode 110, the light-emitting functional layer 130 and the second electrode 120 which are stacked in the direction perpendicular to the base substrate 01; forming an organic material layer 020 (i.e., the first material layer) on the base substrate 01; forming an inorganic nonmetallic material layer 030 (i.e., the second material layer) on the organic material layer 020; the part of the organic material layer directly below the second sub-structure 320 being etched to form the first sub-structure 310 while patterning the inorganic nonmetallic material layer 030 to form the second sub-structure 320. The defining structure 300 includes the first sub-structure 310 and the second sub-structure 320, along the arrangement direction of adjacent sub-pixels 10, the edge of the second sub-structure 320 in the defining structure 300 located between the adjacent sub-pixels 10 protrudes relative to the edge of the first sub-structure 310 to form a protruding portion 301; the light-emitting functional layer 130 is formed after the defining structure 300 is formed, and the light-emitting functional layer 130 includes the plurality of film layers, at least one of the plurality of film layers is disconnected at the protruding portion 301.

Figure 4A:
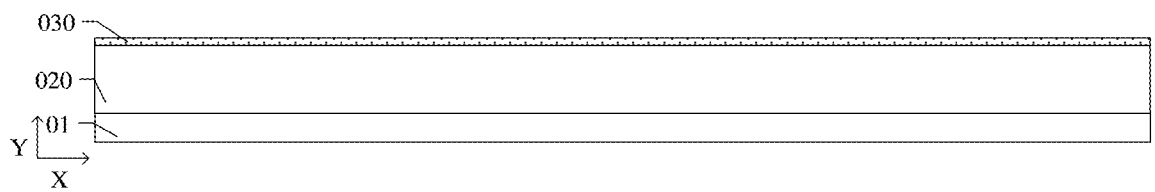
FIG. 4A to FIG. 4D are flow charts of a manufacturing method of the display substrate before the display substrate being formed shown in FIG. 1A.

For example, as illustrated in FIG. 1A and FIG. 4A, the manufacturing method of the display substrate may include preparing a base substrate 01 on a glass carrier. For example, the base substrate 01 may be a flexible base substrate. For example, forming the base substrate 01 may include sequentially forming a first flexible material layer, a first inorganic material layer, a semiconductor layer, a second flexible material layer and a second inorganic material layer stacked on the glass carrier. The materials of first flexible material layer and the second flexible material layer are polyimide (PI), polyethylene terephthalate (PET) or polymer soft film with surface treatment, etc. The materials of the first inorganic material layer and the second inorganic material layer are silicon nitride (SiNx) or silicon oxide (SiOx), etc., which are used to improve the water and oxygen resistance of the base substrate. The first inorganic material layer and the second inorganic material layer are also called barrier layers.

For example, a driving structure layer of the pixel circuit can be formed on the base substrate 01 before the organic material layer 020 is formed. The driving structure layer includes a plurality of pixel circuits, each of the plurality of pixel circuits includes a plurality of transistors and at least one storage capacitor, for example, the pixel circuits can be designed in 2T1C, 3T1C or 7T1C. For example, forming the driving structure layer may include sequentially depositing a first insulating thin film and an active layer thin film on the base substrate 01, patterning the active layer thin film by a patterning process to form a first insulating layer covering the entire base substrate 01 and an active layer pattern arranged on the first insulating layer, wherein the active layer pattern at least includes an active layer. For example, a second insulating thin film and a first metal thin film are sequentially deposited, and the first metal thin film is patterned by a patterning process to form a second insulating layer covering the active layer pattern and a first gate metal layer pattern arranged on the second insulating layer, the first gate metal layer pattern at least includes a gate electrode and a first capacitor electrode. For example, a third insulating thin film and a second metal thin film are deposited sequentially, and the second metal thin film is patterned by a patterning process to form a third insulating layer covering the first gate metal layer and a second gate metal layer pattern arranged on the third insulating layer, the second gate metal layer pattern at least includes a second capacitor electrode, and the position of the second capacitor electrode corresponds to that of the first capacitor electrode. Then, depositing a fourth insulating thin film, patterning the fourth insulating thin film by a patterning process to form a fourth insulating layer covering the second gate metal layer, wherein the fourth insulating layer is provided with at least two first via holes, and the fourth insulating layer, the third insulating layer and the second insulating layer in the two first via holes are etched away to expose a surface of the active layer pattern. Then, depositing a third metal thin film, patterning the third metal thin film by a patterning process and forming a source-drain metal layer pattern on the fourth insulating layer, wherein the source-drain metal layer pattern at least includes a source electrode and a drain electrode located in the display region. The source electrode and the drain electrode can be connected to the active layer in the active layer pattern through the first via holes, respectively.

For example, the above-mentioned first insulating layer, the second insulating layer, the third insulating layer and the fourth insulating layer may adopt any one or more of silicon oxide (SiOx), silicon nitride (SiNx) and silicon oxynitride (SiON), and may each be a single-layer, a multi-layer or a composite layer. The first insulating layer may be a buffer layer for improving the water and oxygen resistance of the base substrate 01; the second insulating layer and the third insulating layer may be a gate insulator (GI) layer; the fourth insulating layer may be an interlayer dielectric (ILD) layer. The first metal thin film, the second metal thin film and the third metal thin film adopt metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), which can each be a single-layer structure or a multi-layer composite structure, such as Ti/Al/Ti, etc. The active layer thin film adopts any one or more materials of amorphous indium gallium zinc Oxide (a-IGZO), zinc oxynitride (ZnON), indium zinc tin oxide (IZTO), amorphous silicon (a-Si), polycrystalline silicon (p-Si), hexathiophene, polythiophene and the like, that is to say, the present disclosure is applicable to transistors manufactured based on oxide technology, silicon technology and organic technology.

Figure 4B:
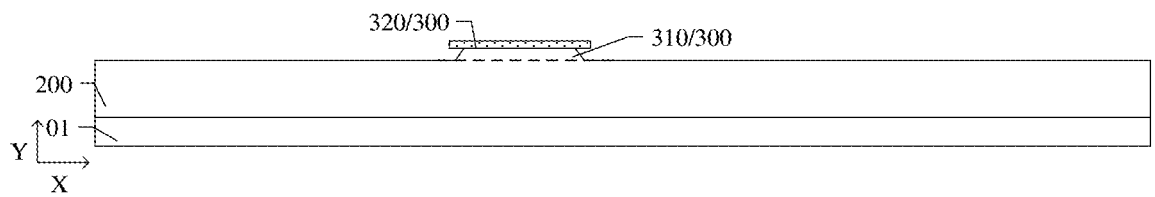

For example, as illustrated in FIG. 4A and FIG. 4B, after the inorganic nonmetallic material layer 030 is formed, the inorganic nonmetallic material layer 030 is patterned. For example, patterning the inorganic nonmetallic material layer 030 includes that a part of the organic material layer 020 located directly below the second sub-structure 320 is dry etched to form the first sub-structure 310 while etching the inorganic nonmetallic material layer 030 by dry etching to form the second sub-structure 320. For example, the inorganic nonmetallic material layer 030 at a position where the second sub-structure 320 is to be formed can be shielded by a mask plate, so that the inorganic nonmetallic material layer 030 at other positions than the position where the second sub-structure 320 is to be formed can be etched. In a process of dry etching the inorganic nonmetallic material layer 030, the etching gas will etch a part of the organic material layer 020 that is not shielded by the mask plate, so that the organic material layer (i.e., the first sub-structure 310) with a certain thickness is left directly below the inorganic nonmetallic material layer (i.e., the second sub-structure 320) after etching, and a side of the organic material layer 020 away from the base substrate 01 forms a protruding portion located directly below the second sub-structure 320, the protruding portion is the first sub-structure 320.

For example, as illustrated in FIG. 4A and FIG. 4B, in the process of dry etching the inorganic nonmetallic material layer 030, the thickness of the organic material layer 020 may be in a range from 100 to 10,000 angstroms, and the thickness of the first sub-structure 310 formed may be in a range from 100 to 10,000 angstroms. For example, in the process of dry etching the inorganic nonmetallic material layer 030, the thickness of the organic material layer 020 may be in a range from 200 to 2000 angstroms, and the thickness of the first sub-structure 310 formed may be in a range from 200 to 2000 angstroms.

Figure 4C:
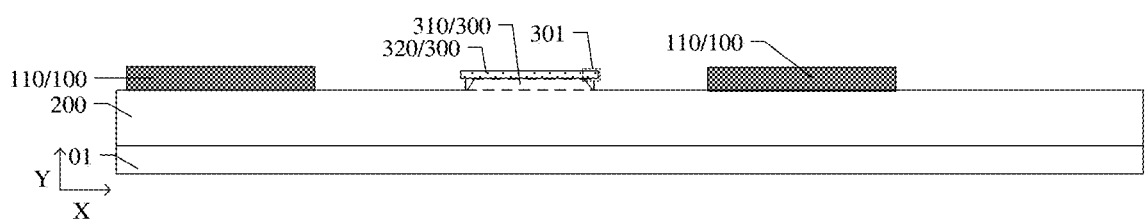

For example, as illustrated in FIG. 1A and FIG. 4C, after the defining structure 300 is formed, the first electrode 110 of the sub-pixel is patterned on the planarization layer 200. For example, the first electrode 110 is connected to the drain electrode of the transistor through a second via hole in the planarization layer 200.

For example, the first electrode 110 may adopt a metal material, such as any one or more of magnesium (Mg), silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may each be a single-layer structure or a multi-layer composite structure, such as Ti/Al/Ti, etc., alternatively, may each be a stack structure formed by metal and transparent conductive materials, such as ITO/Ag/ITO, Mo/AlNd/ITO and other reflective materials.

Figure 4D:
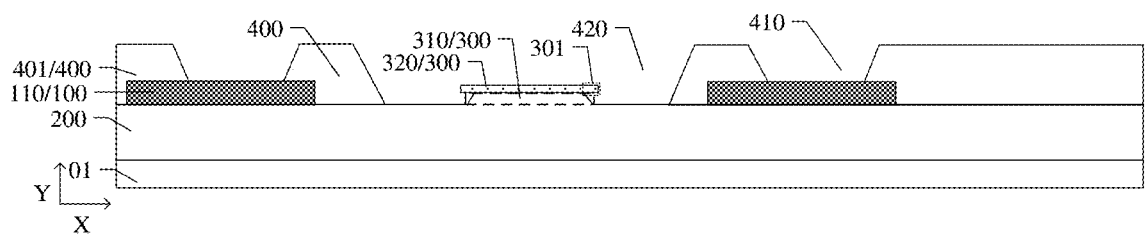

For example, as illustrated in FIG. 1A and FIG. 4D, after the first electrode 110 is formed, a pixel defining pattern 400 may be formed. For example, a pixel defining thin film is coated on the base substrate 01 on which the aforementioned pattern is formed, and the pixel defining pattern 400 is formed by masking, exposure and development processes. For example, the pixel defining pattern 400 of the display region includes a plurality of pixel defining portions 401, and the first opening 410 or the second opening 420 is formed between adjacent pixel define portions 401. The pixel defining thin film in the first opening 410 and the second opening 420 is subjected to developing process and is removed, and the first opening 410 exposes at least a part of the surfaces of the first electrodes 110 of the plurality of sub-pixels, and the second opening 420 exposes the defining structure 300.

For example, after the pixel defining pattern 400 is formed, the spacer may be formed on the pixel define portions. For example, a thin film of organic material is coated on the base substrate 01 on which the aforementioned pattern is formed, and the spacer is formed by masking, exposure and development processes. The spacer can be used as a supporting layer and configured to support fine metal mask (FMM) in an evaporation process.

For example, as illustrated in FIG. 1A, after the spacer is formed, the light-emitting functional layer 130 and the second electrode 120 are sequentially formed. For example, the second electrode 120 may be a transparent cathode. The light-emitting functional layer 130 can emit light from the side away from the base substrate 01 through the transparent cathode to realize top emission. For example, the second electrode 120 may adopt any one or more of magnesium (Mg), silver (Ag), aluminum (Al), or an alloy made of any one or more of the above metals, or a transparent conductive material, such as indium tin oxide (ITO), or a multi-layer composite structure of metals and transparent conductive materials.

For example, forming the light-emitting functional layer 130 may include sequentially forming a hole injection layer and a hole transport layer by evaporation using an open mask; sequentially forming first light-emitting layers 131 by evaporation using FMM emitting different colors, such as a blue light-emitting layer, a green light-emitting layer and a red light-emitting layer; sequentially forming an electron transport layer, a charge generation layer 133 and a hole transport layer by evaporation using an open mask; sequentially forming second light-emitting layers 132 emitting different colors by evaporation using FMM, such as a blue light-emitting layer, a green light-emitting layer and a red light-emitting layer; sequentially forming the electron transport layer, a second electrode and an optical coupling layer by evaporation using an open mask. For example, the hole injection layer, the hole transport layer, the electron transport layer, the charge generation layer, the second electrode and the optical coupling layer are all common layers of the plurality of sub-pixels.

For example, as illustrated in FIG. 1A, the formed light-emitting functional layer 130 is disconnected at the edge of the defining structure 300, so that a part of the light-emitting functional layer 130 located in the second opening 420 of the pixel defining pattern 400 is located on the defining structure 300 and other part is located on the organic layer 200.

For example, after the second electrode 120 is formed, the manufacturing method of the display substrate further includes forming an encapsulation layer, which may include a first encapsulation layer, a second encapsulation layer and a third encapsulation layer which are stacked. The first encapsulation layer adopts inorganic material and covers the second electrode 120 in the display region. The second encapsulation layer adopts organic material. The third encapsulation layer adopts inorganic material and covers the first encapsulation layer and the second encapsulation layer. However, this embodiment is not limited thereto. For example, the encapsulation layer can also adopt an inorganic/organic/inorganic/organic/inorganic five-layer structure.

For example, compared with the display substrate without the defining structure, the display substrate with the defining structure provided by embodiments of the present disclosure only adds one masking process, which has lower influence on the process productivity.

Figure 5:
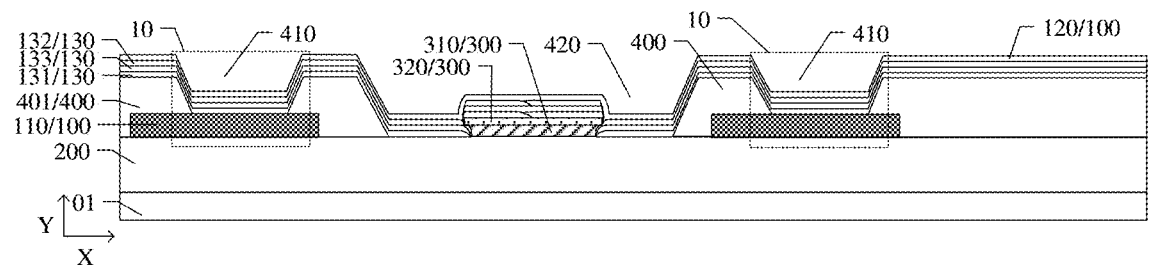
FIG. 5 is a schematic diagram of a partial cross-sectional structure of a display substrate provided according to another example of an embodiment of the present disclosure.

For example, FIG. 5 is a schematic diagram of a partial cross-sectional structure of a display substrate provided according to another example of an embodiment of the present disclosure. The display substrate in the example illustrated in FIG. 5 differs from the display substrate in the example illustrated in FIG. 1A in that the material of the first sub-structure 310 in the display substrate illustrated in FIG. 5 includes inorganic nonmetallic materials. The sub-pixel 10, the base substrate 01 and the pixel defining pattern 400 in the display substrate illustrated in FIG. 5 may have the same characteristics as those in the display substrate illustrated in any of the examples from FIG. 1A to 3B and will not be repeated here.

For example, as illustrated in FIG. 5, the material of the first sub-structure 310 is different from that of the second sub-structure 320. For example, the material of the second sub-structure 320 may include any one or more of silicon nitride, silicon oxide or silicon oxynitride, and the material of the first sub-structure 310 may also include any one or more of silicon nitride, silicon oxide or silicon oxynitride, and the material of the first sub-structure 310 is different from that of the second sub-structure 320.

For example, as illustrated in FIG. 5, the plurality of sub-pixels 10 may include two adjacent sub-pixels 10 arranged in the X direction. For example, at least one edge of the second sub-structure 320 protrudes relative to the corresponding edge of the first sub-structure 310 to form at least one protruding portion 301. For example, as illustrated in FIG. 5, two side edges of the second sub-structure 320 protrude relative to the corresponding edges of the first sub-structure 310 to form two protruding portions 301. For example, the two protruding portions 301 are arranged in the X direction.

For example, FIG. 5 schematically illustrates that the defining structure 300 is arranged between two adjacent sub-pixels 10, and the defining structure 300 includes two protruding portions 301, however it is not limited thereto, two or more defining structures may be arranged between two adjacent sub-pixels, and each defining structure includes at least one protruding portion. By setting the number of defining structures and the number of protruding portions, it is beneficial for at least one layer of the light-emitting functional layer to have a good disconnection effect.

For example, as illustrated in FIG. 5, the orthographic projection of the surface of the first sub-structure 310 facing the second sub-structure 320 on the base substrate 01 is completely located in the orthographic projection of the surface of the second sub-structure 320 facing the base substrate 01.

For example, as illustrated in FIG. 5, the thickness of the first sub-structure 310 is greater than that of the second sub-structure 320 in the direction perpendicular to the base substrate 01.

For example, as illustrated in FIG. 5, in the direction perpendicular to the base substrate 01, the thickness of the defining structure 300 is smaller than that of the pixel define portion 401. For example, an interval is provided between the defining structure 300 and the pixel defining portion 401.

For example, as illustrated in FIG. 5, the surface of the organic layer 200 on the side away from the base substrate 01 exposed by the second opening 420 of the pixel defining pattern 400 may be a flat surface, that is to say, the surface of the organic layer 200 on the side away from the base substrate 01 does not include the protruding portion. For example, as illustrated in FIG. 5, the first sub-structure 310 is disposed on the surface of the organic layer 200 on the side away from the base substrate 01.

For example, as illustrated in FIG. 5, in the direction perpendicular to the base substrate 01, the thickness of the second sub-structure 320 is not greater than that of the light-emitting functional layer 130. For example, the thickness of the second sub-structure 320 may be in a range from 500 to 8000 angstroms.

For example, as illustrated in FIG. 5, in the direction perpendicular to the base substrate 01, the ratio of the thickness of the defining structure 300 to the thickness of the light-emitting functional layer 130 is 0.7 to 1.5. For example, the ratio of the thickness of the defining structure 300 to the thickness of the light-emitting functional layer 130 is 0.8 to 1.2. For example, the ratio of the thickness of the defining structure 300 to the thickness of the light-emitting functional layer 130 is 0.9 to 1.1. An example of the embodiment of the present disclosure can set the thickness of the defining structure, for example, the ratio of the thickness of the defining structure to the thickness of the light-emitting functional layer is set to 0.7-1.5, so that the light-emitting functional layer 130 is disconnected at the edge of the defining structure 300, and the second electrodes 120 are continuous without being interrupted, thereby preventing the crosstalk between adjacent sub-pixels, and ensuring the uniformity of display with the second electrodes uninterrupted.

For example, FIG. 5 schematically illustrates that all the film layers included in the light-emitting functional layer 130 are disconnected at the edge of the defining structure 300, but it is not limited thereto. It is also possible that a part of the film layers of the light-emitting functional layer 130 are disconnected at the edge of the defining structure 300 and another part of the film layers are continuous at the edge of the defining structure 300. The disconnected film layers at the protruding portion 301 can be regarded as dislocated film layers, and the dislocation of the film layers at the protruding portion 301 helps to reduce the transverse crosstalk of the film layers.

Of course, the example illustrated in FIG. 5 is not limited thereto, and the thickness of the defining structure may be set to be larger than that of the light-emitting functional layer, so that both the light-emitting functional layer and the second electrode are disconnected at the edge of the defining structure.

For example, as illustrated in FIG. 5, the first cross section of the first sub-structure 310, which is taken by the plane along the arrangement direction of adjacent sub-pixels 10 and perpendicular to the base substrate 01, includes a rectangle or a trapezoid. For example, the first cross section is trapezoidal, and the length of the bottom edge of the trapezoid on the side away from the base substrate 01 is larger than that of the trapezoid on the side close to the base substrate 01. For example, the included angle between the side edge of the trapezoid and the bottom edge of the trapezoid close to the base substrate 01 is not less than 70 degrees. For example, in the direction parallel to the base substrate 01, the dimension of the protruding portion 301 is not less than 0.01 micron. For example, in the direction parallel to the base substrate 01, the dimension of the protruding portion 301 is not less than 0.1 micron.

For example, as illustrated in FIG. 5, the dimension of the protruding portion 301 may be in a range from 0.01 to 5 microns. For example, the included angle between the side edge of the trapezoid and the bottom edge of the trapezoid close to the base substrate 01 is not less than 90 degrees. For example, the dimension of the protruding portion 301 may be in the range from 0.1 to 2 microns.

For example, the side edge of the first sub-structure 310 may be straight or curved, for example, the curved side edge is curved to the side near the center of the first sub-structure 310 where it is located, in this case, the included angle between the curved side edge of the first sub-structure 310 and the bottom edge close to the base substrate 01 may be the included angle between the tangent line at the midpoint of the curved side edge and the bottom edge, or the included angle between the bottom edge and the tangent line at the intersection of the curved side edge and the bottom edge.

According to embodiments of the present disclosure, by setting the thickness of the defining structure, the dimension of the protruding portion and/or the side edge angle of the first sub-structure, at least one film layer of the light-emitting functional layer can be disconnected at the edge of the defining structure.

For example, as illustrated in FIG. 5, the second cross section of the second sub-structure 320, which is taken by the plane along the arrangement direction of adjacent sub-pixels 10 and perpendicular to the base substrate 01, includes a rectangle or a trapezoid. For example, the shape of the second cross section of the second sub-structure 320 is rectangular, by setting the included angle between the short edge and the long edge of the second cross section of the second sub-structure 320 close to the base substrate 01 to be the right angle or the approximately right angle (for example, the approximately right angle can mean that the difference between the included angle between the two edges and 90 degrees is not more than 10 degrees), it can be beneficial for the light-emitting functional layer 130 to be disconnected at the edge of the second sub-structure 320.

For example, the second cross section of the second sub-structure 320 may be a trapezoid, and the included angle between the side edge of the trapezoid and the bottom edge of the trapezoid on the side close to the base substrate 01 is not less than 70 degrees. For example, the second cross section may be a trapezoid, and the included angle between the side edge of the trapezoid and the bottom edge of the trapezoid on the side close to the base substrate 01 is not less than 90 degrees, so that the included angle between the side edge of the second sub-structure 320 and the bottom edge of the trapezoid on the side away from the base substrate 01 is an acute angle, which can facilitate the light-emitting functional layer 130 to be disconnected at the edge of the defining structure 300.

For example, FIG. 5 schematically illustrates that the first sub-structure 310 includes one film layer and the second sub-structure 320 includes one film layer, but it is not limited thereto. At least one of the first sub-structure 310 and the second sub-structure 320 may include a plurality of film layers, and at least one of the edges of the second sub-structure 320 may protrude relative to the edge of the first sub-structure 310 to form the protruding portion for interrupting at least one film layer of the light-emitting functional layer.

In the case the side edge angle of the defining structure (such as the included angle between the side edge of the first cross section and the bottom edge of the first cross section close to the base substrate, and/or the included angle between the side edge of the second cross section and the bottom edge of the second cross section close to the base substrate) is relatively large, the deposited thickness of the light-emitting functional layer is reduced as a whole, and at least one film layer of the light-emitting functional layer between adjacent sub-pixels is disconnected, so that the resistance of the film layer increases and the crosstalk between adjacent sub-pixels is further reduced.

For example, an embodiment of the present disclosure provides a manufacturing method for forming the display substrate illustrated in FIG. 5, which includes forming a plurality of sub-pixels 10 on a base substrate 01, wherein forming the sub-pixels 10 includes sequentially forming a first electrode 110, a light-emitting functional layer 130 and a second electrode 120 which are stacked in a direction perpendicular to the base substrate 01; forming a first material layer on the substrate 01; forming a second material layer on the first material layer, wherein a material of the second material layer is different from that of the first material layer; forming a defining structure 300 by patterning the first material layer and the second material layer. The first material layer is patterned to form a first sub-structure 310, and the second material layer is patterned to form a second sub-structure 320. The defining structure 300 includes the first sub-structure 310 and the second sub-structure 320 which are stacked. In an arrangement direction of adjacent sub-pixels, an edge of the second sub-structure 320 of the defining structure 300 located between the adjacent sub-pixels protrudes relative to an edge of the first sub-structure 310 to form the protruding portion 301; or, a slope angle between at least a part of a side surface of the second sub-structure 320 and a plane parallel to a contact surface of the first sub-structure 310 and the second sub-structure 320 is a first slope angle, and a slope angle between at least a part of a side surface of the first sub-structure 310 and the plane parallel to the contact surface of the first sub-structure 310 and the second sub-structure 320 is a second slope angle, at least one of the first slope angle and the second slope angle is greater than 60 degrees, and an area of a surface of the second sub-structure 320 close to the first sub-structure 310 is not less than an area of the contact surface between the first sub-structure 310 and the second sub-structure 320. The light-emitting functional layer 130 is formed after the defining structure 300 is formed, and the light-emitting functional layer 130 includes a plurality of film layers, at least one of which is disconnected at an edge of the defining structure 300.

For example, the first material layer and the second material layer are patterned simultaneously to form the defining structure 300. Forming the defining structure 300 includes that a part of the first material layer directly below the second sub-structure 320 is etched to form the first sub-structure 310 simultaneously with patterning the second material layer to form the second sub-structure 320.

For example, both the first material layer and the second material layer are inorganic material layers, and patterning the first material layer and the second material layer simultaneously to form the defining structure 300 includes: simultaneously etching the first material layer and the second material layer by using etching solutions with different etching selectivity ratios, wherein the etching selectivity ratio of the etching solution to the first material layer is larger than that of the etching solution to the second material layer, so that the edge of the first sub-structure 310 formed by etching the first material layer is retracted relative to the edge of the second sub-structure 320 formed by etching the second material layer and an undercut structure is formed.

For example, FIG. 6A to FIG. 6D are flow charts of the manufacturing method of the display substrate before the display substrate formed as illustrated in FIG. 5. As illustrated in FIG. 5, 6A to 6D, the manufacturing method of the display substrate includes: forming the plurality of sub-pixels 10 on the base substrate 01, wherein forming the sub-pixels 10 includes sequentially forming the first electrode 110, the light-emitting functional layer 130 and the second electrode 120 which are stacked in the direction perpendicular to the base substrate 01; forming an organic material layer 020 on the base substrate 01; forming an inorganic nonmetallic material layer 030 on the organic material layer 020, wherein the inorganic nonmetallic material layer 030 includes at least two film layers, such as a film layer 031 (i.e. the first material layer) and a film layer 032 (i.e. the second material layer); patterning the inorganic nonmetallic material layer 030 to form the defining structure 300. The defining structure 300 includes the first sub-structure 310 and the second sub-structure 320, the first sub-structure 310 is located between the second sub-structure 320 and the base substrate 01. Along the arrangement direction of adjacent sub-pixels 10, the edge of the second sub-structure 320 in the defining structure 300 located between the adjacent sub-pixels 10 protrudes relative to the edge of the first sub-structure 310 to form a protruding portion 301; the light-emitting functional layer 130 is formed after the defining structure 300 is formed, and the light-emitting functional layer 130 includes the plurality of film layers, at least one of the plurality of film layers is disconnected at the protruding portion 301.

For example, the manufacturing method of forming the structures such as the base substrate 01, the pixels 10 and the pixel defining pattern 400 in the display substrate illustrated in FIG. 5 can be the same as the manufacturing method of forming the structures such as the base substrate 01, the pixels 10 and the pixel defining pattern 400 in the display substrate illustrated in FIG. 4A to FIG. 4D and will not be repeated here.

Figure 6A:
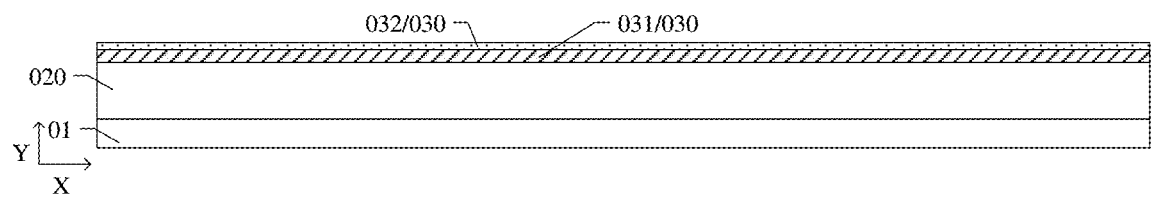
FIG. 6A to FIG. 6D are flow charts of a manufacturing method of the display substrate before the display substrate being formed shown in FIG. 5.
Figure 6B:
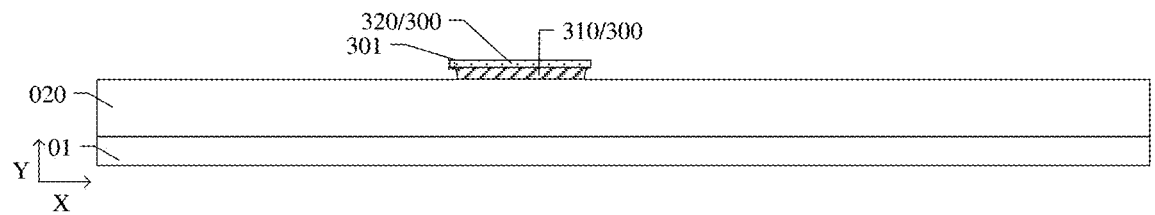

For example, as illustrated in FIG. 6A and FIG. 6B, after the inorganic nonmetallic material layer 030 is formed, the inorganic nonmetallic material layer 030 is patterned. For example, the inorganic nonmetallic material layer 030 may include two film layers, such as a first inorganic nonmetallic material layer 031 and a second inorganic nonmetallic material layer 032, patterning the inorganic nonmetallic material layer 030 includes etching the two film layers included in the inorganic nonmetallic material layer 030 by wet etching. The etching selectivity of the etching solution or etching gas to the first inorganic nonmetallic material layer 031 is greater than that to the second inorganic nonmetallic material layer 032, so that the edge of the first sub-structure 310 formed by etching the first inorganic nonmetallic material layer 031 is retracted relative to the edge of the second sub-structure 320 formed by etching the second inorganic nonmetallic material layer 032 to form an undercut structure, that is to say, to form the protruding portion 301.

Figure 6C:
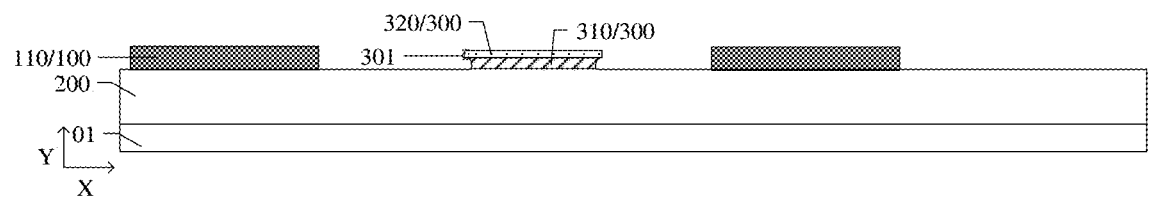

For example, as illustrated in FIG. 6C, after the defining structure 300 is formed, the first electrode 110 of the organic light-emitting element 100 of the sub-pixel is formed by patterning on the planarization layer 200. The method and material for forming the first electrode 110 in this example can be the same as the method and material for forming the first electrode 110 illustrated in FIG. 4C and will not be repeated here.

Figure 6D:
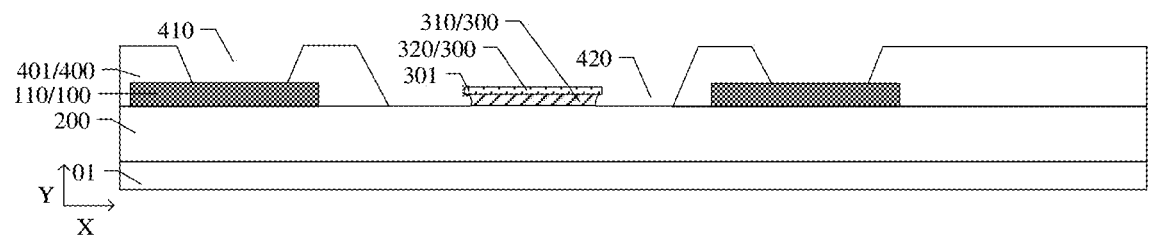

For example, as illustrated in FIG. 6D, after the first electrode 110 is formed, the pixel defining pattern 400 may be formed. The method and material for forming the pixel defining pattern 400 in this example can be the same as those for forming the pixel defining pattern 400 illustrated in FIG. 4D and will not be repeated here. For example, the steps after the pixel defining pattern is formed in this example may be the same as those after the pixel defining pattern is formed on the display substrate illustrated in FIG. 1A and will not be repeated here.

Figure 7:
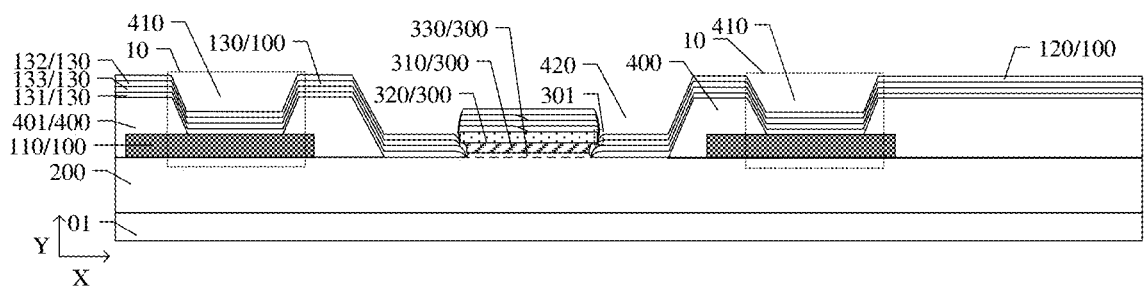
FIG. 7 is a schematic diagram of a partial cross-sectional structure of a display substrate provided according to another example of an embodiment of the present disclosure.

For example, FIG. 7 is a schematic diagram of a partial cross-sectional structure of a display substrate provided according to another example of an embodiment of the present disclosure. The display substrate in the example illustrated in FIG. 7 differs from the display substrate in the example illustrated in FIG. 5 in that the defining structure 300 further includes a third sub-structure 330. The sub-pixel 10, the base substrate 01 and the pixel defining pattern 400 in the display substrate illustrated in FIG. 7 may have the same features as those in the display substrate illustrated in any of FIG. 1A to 3B and FIG. 5, and the description thereof will not be repeated here. The material, shape and dimension relationship of the first sub-structure 310 and the second sub-structure 320 in the display substrate illustrated in FIG. 7 can be the same as that of the first sub-structure 310 and the second sub-structure 320 in the display substrate illustrated in FIG. 5, and the description thereof will not be repeated here.

For example, as illustrated in FIG. 7, the third sub-structure 330 is located between the first sub-structure 310 and the base substrate 01, along the arrangement direction of adjacent sub-pixels 10, an edge of the first sub-structure 310 in the defining structure 300 located between the adjacent sub-pixels 10 protrudes relative to an edge of the third sub-structure 330, and the third sub-structure 330 is an integrated structure with the organic layer 200.

For example, as illustrated in FIG. 7, the third sub-structure 330 may be a part of the organic layer 200. For example, the third sub-structure 330 may be a part of the organic layer 200 protruding to the side away from the base substrate 01. For example, the first sub-structure 310 may be located on a portion of the organic layer 200 protruding to the side away from the base substrate 01.

For example, as illustrated in FIG. 7, the material of the third sub-structure 330 includes photoresist, polyimide (PI) resin, acrylic resin, silicon compound or polyacrylic resin.

For example, as illustrated in FIG. 7, the thickness of the third sub-structure 330 may be in a range from 100 to 10,000 angstroms. For example, the thickness of the third sub-structure 330 may be in a range from 200 to 2000 angstroms.

For example, a cross section of the third sub-structure 330, which is taken by the plane along the arrangement direction of adjacent sub-pixels 10 and perpendicular to the base substrate 01, includes a rectangle. For example, the cross section of the third sub-structure 330, which is taken by the plane along the arrangement direction of adjacent sub-pixels 10 and perpendicular to the base substrate 01, includes a trapezoid, and an included angle between a side edge of the trapezoid and a bottom edge of the trapezoid close to the base substrate 01 is not more than 90 degrees.

For example, as illustrated in FIG. 7, a length of the upper bottom of the trapezoidal cross section of the third sub-structure 330 is smaller than a length of the edge of the cross section of the first sub-structure 310 close to the base substrate 01.

For example, the side edge of the third sub-structure 330 can be straight or curved, for example, the curved side edge is curved to a side away from a center of the third sub-structure 330, or the curved side edge is curved to the side close to the center of the third sub-structure 330, in this case, an included angle between the curved side edge and the lower bottom of the third sub-structure 330 can refer to an included angle between a tangent line at the midpoint of the curved side edge and the lower bottom, or an included angle between the lower bottom and a tangent line at an intersection of the curved side edge and the lower bottom.

For example, the difference between forming the defining structure illustrated in FIG. 7 and forming the defining structure illustrated in FIG. 5 is that a part of the organic material layer 020 located directly below the first sub-structure 320 is dry etched to form the third sub-structure 310 while etching the inorganic nonmetallic material layer 030 by dry etching to form the first sub-structure 310 and the second sub-structure 320. For example, the inorganic nonmetallic material layer 030 at positions where the first sub-structure 310 and the second sub-structure 320 are to be formed can be shielded by a mask plate, so that the inorganic nonmetallic material layer 030 at positions other than the positions where the first sub-structure 310 and the second sub-structure 320 are to be formed is etched. In a process of dry etching the inorganic nonmetallic material layer 030, etching gas can etch a part of the organic material layer 020 that is not shielded by the mask plate, so that the organic material layer (i.e. the third sub-structure 330) with a certain thickness remains directly below the inorganic nonmetallic material layers (i.e. the first sub-structure 310 and the second sub-structure 320) left after etching, so that the side of the organic material layer 020 away from the base substrate 01 forms a protruding portion located directly below the first sub-structure 310 and the second sub-structure 320, the protruding portion is the third sub-structure 330. This example is not limited thereto, the first sub-structure 310 and the second sub-structure 320 can be formed by wet etching, and then the third sub-structure 330 can be formed by dry etching; alternatively, the first sub-structure 310, the second sub-structure 320 and the third sub-structure 330 are formed by a process of first dry etching and then wet etching.

For example, a slope angle between at least a part of the side surface of the third sub-structure 330 and a plane parallel to a contact surface of the first sub-structure 310 and the third sub-structure 330 is a third slope angle, and the third slope angle is greater than 60 degrees. For example, the third slope angle may be 60-150 degrees. For example, the third slope angle is greater than 70 degrees. For example, the third slope angle is greater than 80 degrees. For example, the third slope angle is greater than 90 degrees.

For example, the side surface of the third sub-structure may refer to a surface of the third sub-structure that has a certain angle with the base substrate. For example, the side surface of the third sub-structure may be a plane surface or a curved surface. For example, a line segment of the side surface of the third sub-structure taken by the XY plane may be a straight-line segment or a curved line segment. For example, in the case that the line segment of the side surface of the third sub-structure is a curved segment, the third slope angle may be an included angle between the base substrate and a tangent line at the contact point between the curved segment and the first sub-structure, or an included angle between a tangent line at the contact point between the base substrate and the curved segment and the organic layer 200.

For example, as illustrated in FIGS. 4A and 4B, in the process of dry etching the inorganic nonmetallic material layer 030, the etched thickness of the organic material layer 020 may be 100-10,000 angstroms, and the third sub-structure 330 may be formed to have a thickness of 100-10,000 angstroms. For example, in the process of dry etching the inorganic nonmetallic material layer 030, the etched thickness of the organic material layer 020 may be 200-2000 angstroms, and the third sub-structure 330 may be formed to have a thickness of 200-2000 angstroms.

Figure 8:
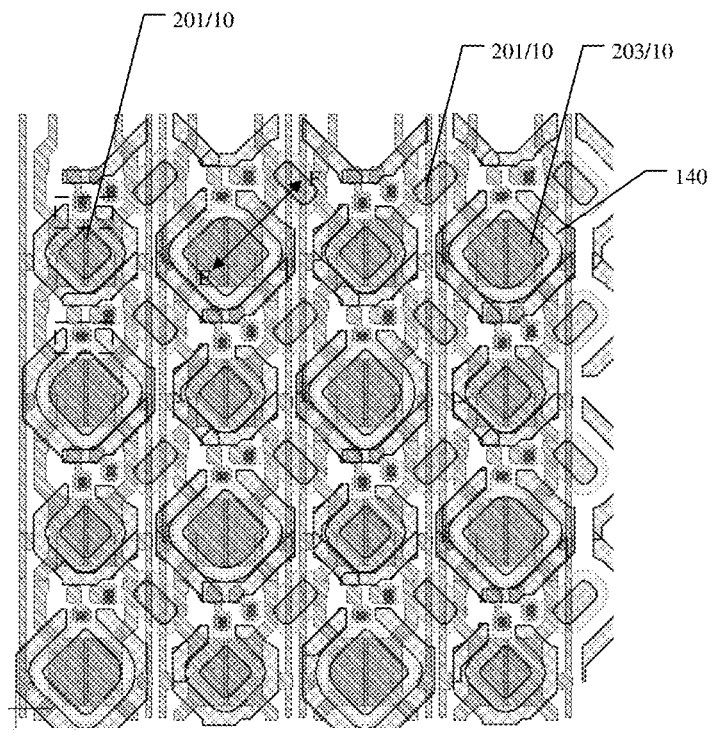
FIG. 8 is a schematic plan structure diagram of a display substrate provided according to an embodiment of the present disclosure.

For example, FIG. 8 is a schematic plan structure diagram of a display substrate provided according to an embodiment of the present disclosure. For example, as illustrated in FIG. 8, the display substrate further includes a defining structure 300 located on the base substrate and between adjacent sub-pixels 10. Thereby, the charge generation layer in the light-emitting functional layer is disconnected at the position where the defining structure 300 is located. The plurality of sub-pixels 10 include a plurality of first color sub-pixels 201, a plurality of second color sub-pixels 202 and a plurality of third color sub-pixels 203, and the defining structure 300 includes a plurality of ring-shaped defining structures, each of the plurality of ring-shaped defining structures surrounds one of the first color sub-pixel 201, the second color sub-pixel 202 and the third color sub-pixel 203; that is to say, each ring-shaped defining structure surrounds one first color sub-pixel 201, one second color sub-pixel 202 or one third color sub-pixel 203. In addition, the ring-shaped defining structure can be a closed ring or an unclosed ring, such as a ring with at least one notch.

For example, the defining structure 300 may be in the shape of a strip, or it may separate adjacent first color sub-pixel and second color sub-pixel and separate adjacent first color sub-pixel and third color sub-pixel.

In the display substrate provided by the embodiment of the present disclosure, the defining structure is arranged between adjacent sub-pixels, and the charge generation layer of the light-emitting functional layer is disconnected at the position where the defining structure is located, thereby avoiding the crosstalk between adjacent sub-pixels caused by the charge generation layer with higher conductivity. Furthermore, because the defining structure includes the plurality of ring-shaped defining structures, each of the plurality of ring-shaped defining structure surrounds one first color sub-pixel, one second color sub-pixel or one third color sub-pixel, the defining structure can realize the disconnection of most adjacent sub-pixels by the simple ring-shaped defining structure, thus avoiding the crosstalk between adjacent sub-pixels. On the other hand, because the display substrate can avoid the crosstalk between adjacent sub-pixels by the defining structure, the display substrate can improve the pixels per inch while adopting a tandem emitting light (Tandem EL) design. Therefore, the display substrate has the advantages of long service life, low power consumption, high brightness and high resolution. Another embodiment of the present disclosure provides a display device, which includes the display substrate in any one of the examples illustrated in FIG. 1A to 8. By arranging the defining structure between adjacent sub-pixels in the display device, at least one layer of the light-emitting functional layer (e.g., the charge generation layer) can be disconnected at the edge of the defining structure, which is beneficial to reducing the probability of crosstalk between adjacent sub-pixels.

For example, the display device further includes a cover plate on a light-emitting side of a display panel.

For example, the display device can be a display device such as an organic light emitting diode display device or the like, and any product or component with a display function including the display device, such as a television, a digital camera, a mobile phone, a watch, a tablet computer, a notebook computer, a navigator, etc. This embodiment is not limited thereto.

The following statements should be noted:
(1) The accompanying drawings related to the embodiment(s) of the present disclosure involve only the structure(s) in connection with the embodiment(s) of the present disclosure, and other structure(s) can be referred to common design(s).
(2) In case of no conflict, features in one embodiment or in different embodiments of the present disclosure can be combined.

The foregoing is merely exemplary embodiments of the invention, but is not used to limit the protection scope of the invention. The protection scope of the invention shall be defined by the attached claims.

What is claimed is:
1. A display substrate, comprising:
a base substrate, comprising at least a first display region;
a plurality of sub-pixels located in the first display region on the base substrate, each sub-pixel of at least a part of the plurality of sub-pixels comprising a light-emitting element, the light-emitting element comprising a light-emitting functional layer and a first electrode and a second electrode located on two sides of the light-emitting functional layer in a direction perpendicular to the base substrate, the first electrode being located between the light-emitting functional layer and the base substrate, and the light-emitting functional layer comprising a plurality of film layers,
a pixel defining pattern located at a side of the first electrode away from the base substrate, the pixel defining pattern located at least in the first display region comprising a plurality of first openings, one sub-pixel corresponding to at least one first opening, the light-emitting element of the sub-pixel at least partially located in the first opening corresponding to the sub-pixel, and the first opening being configured to expose the first electrode,
wherein the display substrate further comprises a defining structure, at least one defining structure is arranged between at least two adjacent sub-pixels, and the defining structure comprises a first sub-structure and a second sub-structure which are stacked, the first sub-structure is located between the second sub-structure and the base substrate, and a material of the first sub-structure is different from that of the second sub-structure;
along an arrangement direction of adjacent sub-pixels, an edge of the second sub-structure in the defining structure between the adjacent sub-pixels protrudes relative to an edge of the first sub-structure to form a protruding portion; or, a slope angle between at least a part of a side surface of the second sub-structure and a plane parallel to a contact surface of the first sub-structure and the second sub-structure is a first slope angle, a slope angle between at least a part of a side surface of the first sub-structure and the plane parallel to the contact surface of the first sub-structure and the second sub-structure is a second slope angle, and at least one of the first slope angle and the second slope angle is greater than 60 degrees, and a surface area of the second sub-structure close to the first sub-structure is not less than an area of the contact surface between the first sub-structure and the second sub-structure, at least one of the plurality of film layers is disconnected at the defining structure, the pixel defining pattern further comprises a plurality of second openings, and at least a part of the defining structure is exposed by the second opening.

2. The display substrate according to claim 1, wherein the material of the first sub-structure comprises an organic material, and the material of the second sub-structure comprises an inorganic nonmetallic material.

3. The display substrate according to claim 1, wherein each of the material of the first sub-structure and the material of the second sub-structure comprises inorganic nonmetallic materials.

4. The display substrate according to claim 2, further comprising:

an organic layer, located between the second sub-structure and the base substrate.

5. The display substrate according to claim 4, wherein the material of the first sub-structure comprises an organic material, and the first sub-structure and the organic layer are an integrated structure; or the material of the first sub-structure comprises an inorganic nonmetallic material, and the first sub-structure is arranged on a surface of the organic layer on a side away from the base substrate.

6. The display substrate according to claim 4, wherein the defining structure further comprises a third sub-structure located between the first sub-structure and the base substrate, along the arrangement direction of adjacent sub-pixels, the edge of the first sub-structure in the defining structure between the adjacent sub-pixels protrudes relative to an edge of the third sub-structure, and the third sub-structure and the organic layer are an integrated structure.

7. The display substrate according to claim 1, wherein a first cross section of the first sub-structure taken by a plane along the arrangement direction of the adjacent sub-pixels and perpendicular to the base substrate comprises a rectangle; or the first cross section of the first sub-structure taken by the plane along the arrangement direction of the adjacent sub-pixels and perpendicular to the base substrate comprises a trapezoid, and a length of a bottom edge of the trapezoid on a side away from the base substrate is greater than a length of a bottom edge of the trapezoid on a side close to the base substrate; or the first cross section of the first sub-structure taken by the plane along the arrangement direction of adjacent sub-pixels and perpendicular to the base substrate comprises a trapezoid, and the length of the bottom edge of the trapezoid on the side away from the base substrate is smaller than the length of the bottom edge of the trapezoid on the side close to the base substrate.

8. The display substrate according to claim 1, wherein the first cross section of the first sub-structure taken by the plane along the arrangement direction of the adjacent sub-pixels and perpendicular to the base substrate comprises two short edges and two long edges extending in a direction parallel to the base substrate, the long edges are connected with the short edges, an included angle between the long edge close to the base substrate and the short edge in the first cross section is a first included angle, and an included angle between the long edge away from the base substrate and the short side in the first section is a second included angle, the first included angle is in a range from 70 to 110 degrees, and/or the second included angle is in a range from 70 to 110 degrees.

9. The display substrate according to claim 1, wherein a dimension of the protruding portion is not less than 0.01 micron in a direction parallel to the base substrate.

10. The display substrate according to claim 1, wherein a ratio of a thickness of the defining structure to a thickness of the light-emitting functional layer in the direction perpendicular to the base substrate is in a range from 0.7 to 1.5.

11. The display substrate according to claim 1, wherein, in a direction perpendicular to the base substrate, a thickness of the second sub-structure is in a range from 100 to 10,000 angstroms, and a thickness of the first sub-structure is in a range from 100 to 10,000 angstroms.

12. The display substrate according to claim 1, wherein the second electrodes are continuously arranged at the defining structure.

13. The display substrate according to claim 1, wherein the at least one of the plurality of film layers comprises a charge generation layer, and the light-emitting functional layer comprises a first light-emitting layer, the charge generation layer and a second light-emitting layer which are stacked, the charge generation layer is located between the first light-emitting layer and the second light-emitting layer, and the charge generation layer is disconnected at the defining structure.

14. The display substrate according to claim 13, wherein the film layer of the light-emitting functional layer on a side of the charge generation layer facing the base substrate is disconnected at the defining structure.

15. The display substrate according to claim 1, wherein the light-emitting functional layer comprises a light-emitting layer, and an area of an orthographic projection of at least one disconnected film layer in the light-emitting functional layer on the base substrate is larger than that of an orthographic projection of the light-emitting layer on the base substrate.

16. The display substrate according to claim 1, wherein the light-emitting functional layer comprises at least one light-emitting layer, and the film layers of the light-emitting functional layer disconnected at the defining structure comprise at least one light-emitting layer and at least one other film layer;

an area of an orthogonal projection of the at least one other film layer disconnected on the base substrate is larger than that of the at least one light-emitting layer disconnected on the base substrate; or an area of a part of the at least one other film layer, which is disconnected, for covering the defining structure is larger than that of the at least one light-emitting layer, which is disconnected, for covering the defining structure.

17. The display substrate according to claim 13, wherein a thickness of a part of the second electrode overlapped with a projection of an edge of the defining structure on the base substrate is smaller than a thickness of at least a part of the second electrode not overlapped with the projection of the defining structure on the base substrate, and a thickness of a part of the charge generation layer overlapped with the projection of the edge of the defining structure on the base substrate is smaller than a thickness of a part of the charge generation layer not overlapped with the projection of the defining structure on the base substrate.

18. The display substrate according to claim 1, wherein the at least one of the plurality of film layers comprises a charge generation layer which is disconnected along at least a part of an edge of the defining structure, the second electrode covers a disconnected position of the charge generation layer, and a part of the second electrode located in the second opening comprises a first portion located on the defining structure and a second portion located at a position outside the defining structure, an orthographic projection of the first portion on the base substrate overlaps or connects with an orthographic projection of the second portion on the base substrate.

19. A display substrate, comprising:
a base substrate, comprising at least a first display region;
a plurality of sub-pixels located in the first display region on the base substrate, each sub-pixel of at least a part of the plurality of sub-pixels comprising a light-emitting element, the light-emitting element comprising a light-emitting functional layer and a first electrode and a second electrode located on two sides of the light-emitting functional layer in a direction perpendicular to the base substrate, the first electrode being located between the light-emitting functional layer and the base substrate, and the light-emitting functional layer comprising a plurality of film layers,
wherein the display substrate further comprises a defining structure, at least one defining structure is arranged between at least two adjacent sub-pixels, and the defining structure comprises a first sub-structure and a second sub-structure which are stacked, the first sub-structure is located between the second sub-structure and the base substrate, and a material of the first sub-structure is different from that of the second sub-structure;

along an arrangement direction of adjacent sub-pixels, an edge of the second sub-structure in the defining structure between the adjacent sub-pixels protrudes relative to an edge of the first sub-structure to form a protruding portion; or, a slope angle between at least a part of a side surface of the second sub-structure and a plane parallel to a contact surface of the first sub-structure and the second sub-structure is a first slope angle, a slope angle between at least a part of a side surface of the first sub-structure and the plane parallel to the contact surface of the first sub-structure and the second sub-structure is a second slope angle, and at least one of the first slope angle and the second slope angle is greater than 60 degrees, and a surface area of the second sub-structure close to the first sub-structure is not less than an area of the contact surface between the first sub-structure and the second sub-structure, at least one of the plurality of film layers is disconnected at the defining structure, the material of the first sub-structure comprises an organic material, and the material of the second sub-structure comprises an inorganic nonmetallic material; in a direction perpendicular to the base substrate, a thickness of the first sub-structure is in a range from 100 to 10,000 angstroms, and the second electrode is not in contact with the first sub-structure; the display substrate further comprises an organic layer located between the second sub-structure and the base substrate, the first electrode is in contact with a surface of the organic layer on a side away from the base substrate, and the first sub-structure and the organic layer are an integrated structure.

* * * * *